United States Patent
Onno

(10) Patent No.: US 6,728,413 B2
(45) Date of Patent: *Apr. 27, 2004

(54) LATTICE VECTOR QUANTIZATION IN IMAGE COMPRESSION AND DECOMPRESSION

(75) Inventor: Patrice Onno, Rennes (FR)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,213

(22) Filed: Jan. 19, 1999

(65) Prior Publication Data

US 2003/0072494 A1 Apr. 17, 2003

(30) Foreign Application Priority Data

Jan. 19, 1998 (FR) ............................................. 98 00506
Jan. 19, 1998 (FR) ............................................. 98 00505

(51) Int. Cl.[7] .............................. G06K 9/36; G06K 9/46
(52) U.S. Cl. .................................... 382/253; 375/240.22
(58) Field of Search ............................ 341/51, 52, 63, 341/106; 348/404.1, 405.1, 414.1, 417.1, 422.1; 358/261.2, 430; 375/240.02, 240.03, 240.22, 240.25; 382/232, 233, 238, 239, 251, 253

(56) References Cited

U.S. PATENT DOCUMENTS

| | | | |
|---|---|---|---|
| 3,925,780 A | * 12/1975 | Voorhis | 341/63 |
| 4,882,585 A | * 11/1989 | Beard | 341/106 |
| RE34,562 E | * 3/1994 | Murakami et al. | 348/417.1 |
| 5,341,441 A | * 8/1994 | Maeda et al. | 382/253 |
| 5,764,805 A | * 6/1998 | Martucci et al. | 382/238 |
| 5,838,823 A | * 11/1998 | Ancessi | 382/232 |
| 5,940,542 A | * 8/1999 | Li et al. | 382/253 |

FOREIGN PATENT DOCUMENTS

FR   2737823   * 2/1997 ............ H03M/7/30

OTHER PUBLICATIONS

French Search Report (stamped Sep. 18, 1998); French Search Report (stamped Sep. 25, 1998).
Jean–Pierre Adoul et al., "Nearest Neighbor Algorithm for Spherical Codes from the Leech Lattice," IEEE Transactions on Information Theory, vol. 38, No. 5II, Sep. 1988, pp. 1188–1202.
Claude Lamblin et al., "Algorithme de quantification vectorielle sphérique á partir du réseau de Gosset d'ordre 8," Annales des Télécommunications, vol. 43, No. 3–4, 1988, pp 172–186.

* cited by examiner

Primary Examiner—Timothy M. Johnson
(74) Attorney, Agent, or Firm—Fitzpatrick, Cella, Harper & Scinto

(57) ABSTRACT

The invention proposes a method of determining an index of a code vector ($VC_k$) belonging to a predetermined lattice, characterised in that it includes the steps of:

determining (E47) a leader vector (Y, $VL_k$) for the code vector ($VC_k$), seeking (E50, E51) a permutation number (NP) between the code vector and the leader vector, determining (E51) the index ($I_k$) for the code vector according to the permutation number.

The invention makes it possible to code a code vector, for example in the context of the lattice vector quantization of a digital signal.

24 Claims, 19 Drawing Sheets

| Index to be coded | Code |
|---|---|
| 0 | 00000 |
| 1 | 00001 |
| 2 | 00010 |
| 3 | 00011 |
| 4 | 0010 |
| 5 | 0011 |
| 6 | 0100 |
| 7 | 0101 |
| 8 | 0110 |
| 9 | 0111 |
| 10 | 1000 |
| 11 | 1001 |
| 12 | 1010 |
| 13 | 1011 |
| 14 | 1100 |
| 15 | 1101 |
| 16 | 1110 |
| 17 | 1111 |
| cost | 4.22 bits/ ev. |
| 10 000 events | 42 222 bits |

*Fig. 9a*

| Index to be coded | Code |
|---|---|
| 0 | 00000 |
| 1 | 00001 |
| 2 | 00010 |
| 3 | 00011 |
| 4 | 00100 |
| 5 | 00101 |
| 6 | 00110 |
| 7 | 00111 |
| 8 | 01000 |
| 9 | 01001 |
| 10 | 01010 |
| 11 | 01011 |
| 12 | 01100 |
| 13 | 01101 |
| 14 | 01110 |
| 15 | 01111 |
| 16 | 10000 |
| 17 | 10001 |
| cost | 5 bits/ ev. |
| 10 000 events | 50 000 bits |

*Fig. 9b*

LATTICE VECTOR QUANTIZATION IN IMAGE COMPRESSION AND DECOMPRESSION

FIELD OF THE INVENTION

The present invention concerns a digital signal coding device and method, and the corresponding decoding device and method.

The signal to be coded may be of any type. The signal is in general terms a set of data representing physical quantities. The following text will be concerned with a digital image, by way of example.

RELATED ART

A conventional digital image is a matrix of for example 512×512 pixels coded in eight bits. Transmitting such an image over a low-speed channel requires several tens of minutes. Image compression techniques have been developed to reduce the transmission time.

Vector quantization is frequently used for image coding. Such a quantization uses a code vector dictionary, which can be a lattice, for example of the $D_n$ type, each element of which is represented for example by its Cartesian coordinates, or by a polar representation.

In order to comply with the statistics of the data, it is preferable to represent a code vector of the lattice by its polar coordinates, namely its norm and an index representing its position on an isonorm. The norm of a vector is calculated in a conventional fashion, using a predetermined norm.

In a first aspect, in order to determine the index of a code vector, it is known that it is possible to use a table of correspondence between all the code vectors, represented in Cartesian coordinates, and their respective indices. This table of correspondence is very large, and consequently requires a large amount of memory space. In addition, the size of the table of correspondence is in general related to the maximum transmission rate of the coded data.

The present invention aims to remedy these drawbacks by providing a rapid method for determining the index of a code vector in a lattice of the $D_n$ type.

In a second aspect, the coding of the index of a code vector is the coding of one event amongst a known group of events.

For this purpose, it is known how to code each event in a number of bits corresponding to the power of two greater than the number of events. Each event is thus coded in a unique fashion. However, this technique use a large number of bits.

Another known technique is entropic coding, for example of the Huffman type. This technique requires a large amount of calculation time and generates tables which occupy a large amount of memory space, notably when there are a large number of events to be coded.

BRIEF SUMMARY OF THE INVENTION

The present invention aims to remedy these drawbacks by providing a method of coding an event included in a known group of events, which provides a more compact code.

To this end, the invention first of all proposes a method of determining an index of a code vector belonging to a predetermined lattice, characterised in that it includes the steps of:

determining a leader vector for the code vector, seeking a permutation number between the code vector and the leader vector, determining the index for the code vector according to the permutation number.

Correlatively, the invention proposes a device for determining an index of a code vector belonging to a predetermined lattice, characterised in that it has:

means of determining a leader vector for the code vector, means of seeking a permutation number between the code vector and the leader vector, means of determining the index for the code vector as a function of the permutation number.

The coding according to the invention can be implemented rapidly. It requires only a limited number of calculations, since seeking the index of a code vector is a search over a limited number of vectors.

The invention has the advantage of not requiring the use of a table of correspondence between code vectors and their respective indices, which saves on memory space and imposes no constraint on the transmission rate of the coded data.

The invention also concerns a method of coding a code vector included in a known group of vectors belonging to a predetermined lattice, the said vectors having the same norm, in the sense of a predetermined norm, characterised in that it includes the steps of:

determining a leader vector for the code vector, seeking a permutation number between the code vector and the leader vector, determining an index for the code vector as a function of the permutation number.

The invention applies to the coding of a set of data representing physical quantities, characterised in that it includes the steps of:

dividing the set of data into vectors, then, for each of the vectors resulting from the division, vector quantization of the vector so as to determine a code vector belonging to a predetermined lattice, determining a leader vector for the code vector, seeking a permutation number between the code vector and the leader vector, determining an index for the code vector as a function of the permutation number.

The invention then has advantages similar to those described previously.

According to a preferred characteristic, the coding method includes the steps of:

determining an area of the lattice according to the norm of the code vector, seeking a set of leader vectors in the area, seeking a sub-set of leader vectors having the same norm as the code vector, calculating the sum of a respective number of permutations of the leader vectors of the sub-set which are different from the leader vector relating to the code vector, and of the permutation number between the code vector and its leader vector.

Thus the seeking of the leader vector and of the permutation number between the vector to be coded and the leader vector is effected on a reduced number of vectors.

According to a preferred characteristic, the permutation number is determined by applying the Schalkwijk method to the code vector and to the leader vector. This method can be implemented rapidly.

The coding device includes means of using the above characteristics which have advantages similar to those disclosed above.

The invention also concerns a method of decoding a code vector belonging to a predetermined lattice, whose coded form includes a norm and an index, characterised in that it includes the steps of:

determining a leader vector for the code vector, determining a permutation number between the code vector and the leader vector, according to the index, determining the code vector according to the permutation number.

Correlatively, the invention proposes a device for decoding a code vector belonging to a predetermined lattice, whose coded form includes a norm and an index, characterised in that it has:

means of determining a leader vector for the code vector, means of determining a permutation number between the code vector and the leader vector, according to the index, means of determining the code vector according to the permutation number.

According to a preferred characteristic, the decoding method includes the step of determining an area of the lattice as a function of the norm of the code vector, and the leader vector is sought in this area.

According to another preferred characteristic, the code vector is determined by applying the inverse Schalkwijk method to the permutation number and to the leader vector.

The decoding can be implemented rapidly, since there also searches are carried out on a limited number of vectors.

The decoding method and device make it possible to find the code vectors, for example in a receiving apparatus corresponding to a sending apparatus in which the signal was coded according to the invention.

In the second aspect, the invention proposes a method of coding an event included in a known group of events, characterised in that it includes the steps of:

determining a first number and a second number of bits which can be used to code an event, as a function of the number of events in the group, coding the event by using the first number of bits or the second number of bits according to a selection criterion.

Correlatively, the invention proposes a device for coding an event included in a known group of events, characterised in that it has:

means of determining a first number and a second number of bits which can be used for coding an event, as a function of the number of events in the group, means of coding the event by using the first number of bits or the second number of bits according to a selection criterion.

The method and device generate a code of variable length, whose decoding is unique. The code of variable length is more compact than a code based on the powers of two.

In addition, the coding and decoding can be implemented rapidly, since they entail only simple calculations. In particular, the invention requires no table to be stored, unlike Huffman coding.

The invention applies more particularly to the coding of a code vector included in a known group of code vectors. The method then includes the steps of:

determining a first number and a second number of bits which can be used for coding a code vector, according to the number of vectors in the group, coding the code vector by using the first number of bits or the second number of bits according to a selection criterion.

An index is then associated with the code vector, for example to represent its position on an isonorm, or its ranking in a dictionary.

The invention also concerns a method of coding a set of data representing physical quantities, characterised in that it includes the steps of:

dividing the set of data into vectors, then, for each of the vectors resulting from the division, vector quantization of the vector, using a known set of code vectors, determining a group of code vectors to which the code vector used for quantizing the vector belongs, determining a first number and a second number of bits which can be used for coding the code vector, according to the number of code vectors belonging to the group, coding the code vector using the first number of bits or the second number of bits according to a selection criterion.

By virtue of the invention, the compression rate expressed in bits per symbol is close to entropy.

According to preferred characteristics, the determination of the first number of bits includes the calculation of the logarithm to the base 2 of the number of events in the group, and the determination of the second number of bits includes the calculation of the logarithm to the base 2 of the number of events of the group increased by one unit. The length of the codes used is thus directly related to the number of events to be coded and is simple and rapid to determine.

According to another preferred characteristic, the selection of the first number of bits or of the second number of bits includes the steps of:

allocating an integer index to the event, determining a delimiter, comparing the index with the delimiter, in order to select the first number of bits or the second number of bits according to the result of the comparison.

Selection of the first or second number of bits is very rapid since it entails only simple calculations.

When the selection is made, the invention includes the steps of:

coding the index decreased by half the delimiter, using the first number of bits, if the index is greater than or equal to the delimiter, coding the index using the second number of bits, if the index is less than the delimiter.

The coding proper of the index is thus very rapid.

According to another preferred characteristic, the delimiter depends on the number of events contained in the group.

In another aspect, the invention concerns a method of decoding an event included in a known group of events, the said event being coded using a first or a second number of bits, the second number being greater than the first number, characterised in that it includes the steps of:

reading the first number of bits, comparing the value read with a delimiter, in order to determine whether the event is coded using the first or the second number of bits.

Correlatively, the invention proposes a device for decoding an event included in a known group of events, the said event be coded using a first or a second number of bits, the second number being greater than the first number, characterised in that it has:

means of reading the first number of bits, means of comparing the value read with a delimiter, in order to determine whether the event is coded using the first or the second number of bits.

The decoding method and device make it possible to find the index representing the coded event very simply. As already stated, the event can be a code vector.

The present invention also concerns a data processing device, a communication device, such as computer, printer or facsimile apparatus, including the preceding coding and decoding device.

The present invention also concerns a storage medium, such as a floppy disk or a CD-ROM.

The advantages of these devices and storage medium are similar to those previously described.

BRIEF DESCRIPTION OF THE DRAWINGS

The characteristics and advantages of the present invention will emerge more clearly from the reading of several embodiments illustrated by the accompanying drawings, in which:

FIG. 9a depicts an example of coding of code vectors obtained with the invention, FIG. 9b depicts an example of coding of code vectors according to the prior art.

DETAILED DESCRIPTION OF THE INVENTION

Figure 1:
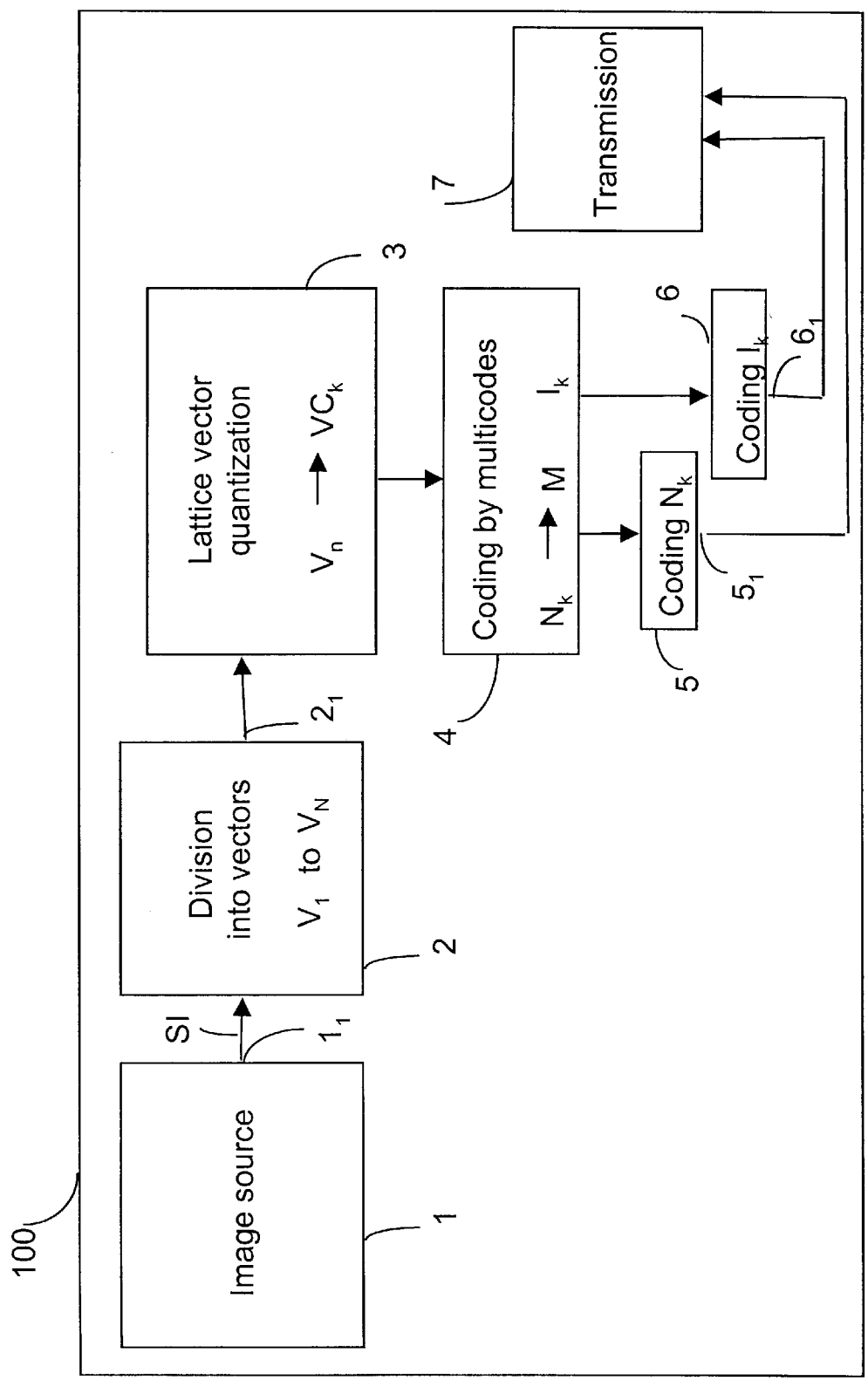
FIG. 1 is a block diagram of an embodiment of a digital signal coding device according to the invention, FIG. 2a schematically depicts a digital image to be transmitted by the device of FIG. 1, FIG. 2b schematically depicts an image divided into vectors in the device of FIG. 1.

According to the embodiment chosen and depicted in FIG. 1, a coding device according to the invention is designed to code a digital signal for the purpose of compressing it. The coding device is integrated into an apparatus 100, which is for example a digital photographic apparatus, or a digital camcorder, or a data base management system, or again a computer.

The digital signal to be compressed SI is in this particular embodiment a series of digital samples representing an image.

The device has a signal source 1, here an image signal source. In general terms, the signal source either contains the digital signal, and is for example a memory, a hard disk or a CD-ROM, or converts an analogue signal into a digital signal, and is for example an analogue camcorder associated with an analogue to digital converter.

The image signal SI is a series of digital words, for example bytes. Each byte value represents a pixel of an image IM with 256 grey levels, or black and white image.

The image source 1 can also generate a sub-band of an image resulting from a breaking down of the image into frequency sub-bands. The sub-band has coefficients which will be dealt with hereinafter as the pixels of an image.

An output $1_1$ of the signal source is connected to a circuit for dividing into vectors 2. This circuit receives, from the source 1, the image IM depicted in FIG. 2a, which is a matrix with L rows and C columns having L.C pixels $P_{1,1}$ to $P_{L,C}$, L and C being integers for example equal to 512. The division circuit 2 divides the image IM by block, or vector, into a divided image IMD shown in FIG. 2b. The image IMD has N vectors $V_1$ to $V_N$, where N is an integer. The vectors formed are adjacent, and any vector $V_n$, with n lying between 1 and N, is a rectangular block of adjacent pixels of the image IM. The vector $V_n$ has a predetermined size, for example 4×4 pixels.

The formation of the vectors, known per se, can be carried out in different ways. For example, the vectors overlap, or are groups of non-adjacent pixels in the original image.

With reference once again to FIG. 1, the circuit for dividing into vectors has an output $2_1$ connected to a lattice vector quantization circuit 3.

Lattice vector quantization, referred to as LVQ, consists overall of coding a vector $V_n$ by seeking the code vector $VC_k$ which is its closest neighbour, in the sense of a predetermined norm, amongst the vectors of a lattice. Lattice vector quantization is for example described in the article "A fast encoding method for lattice codes and quantizers" by J H Conway and N J A Sloane, which appeared in IEEE Transactions on Information Theory, No 29, 1983, pages 820 to 824.

Figure 3:
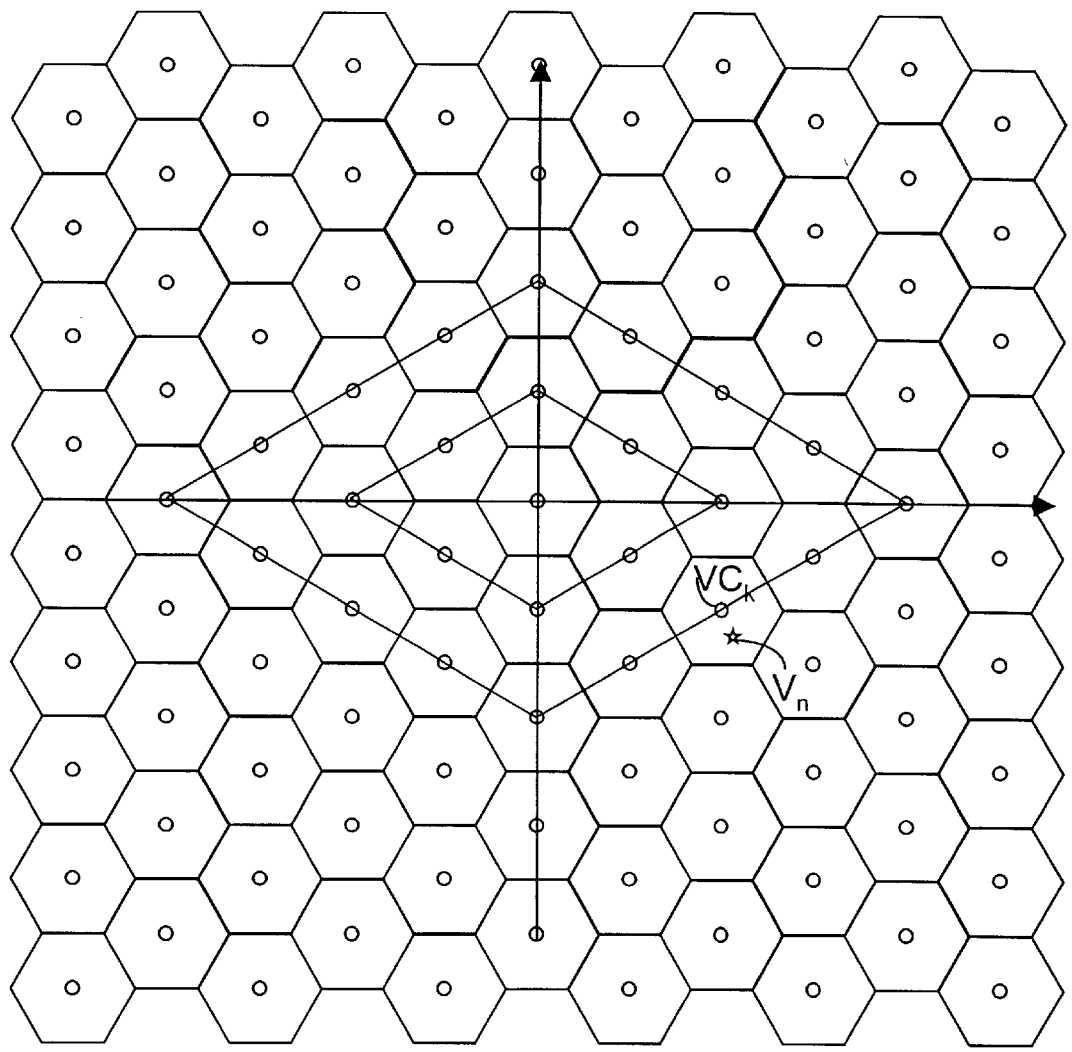
FIG. 3 depicts a code vector lattice in 2 dimensions.
Figure 4:
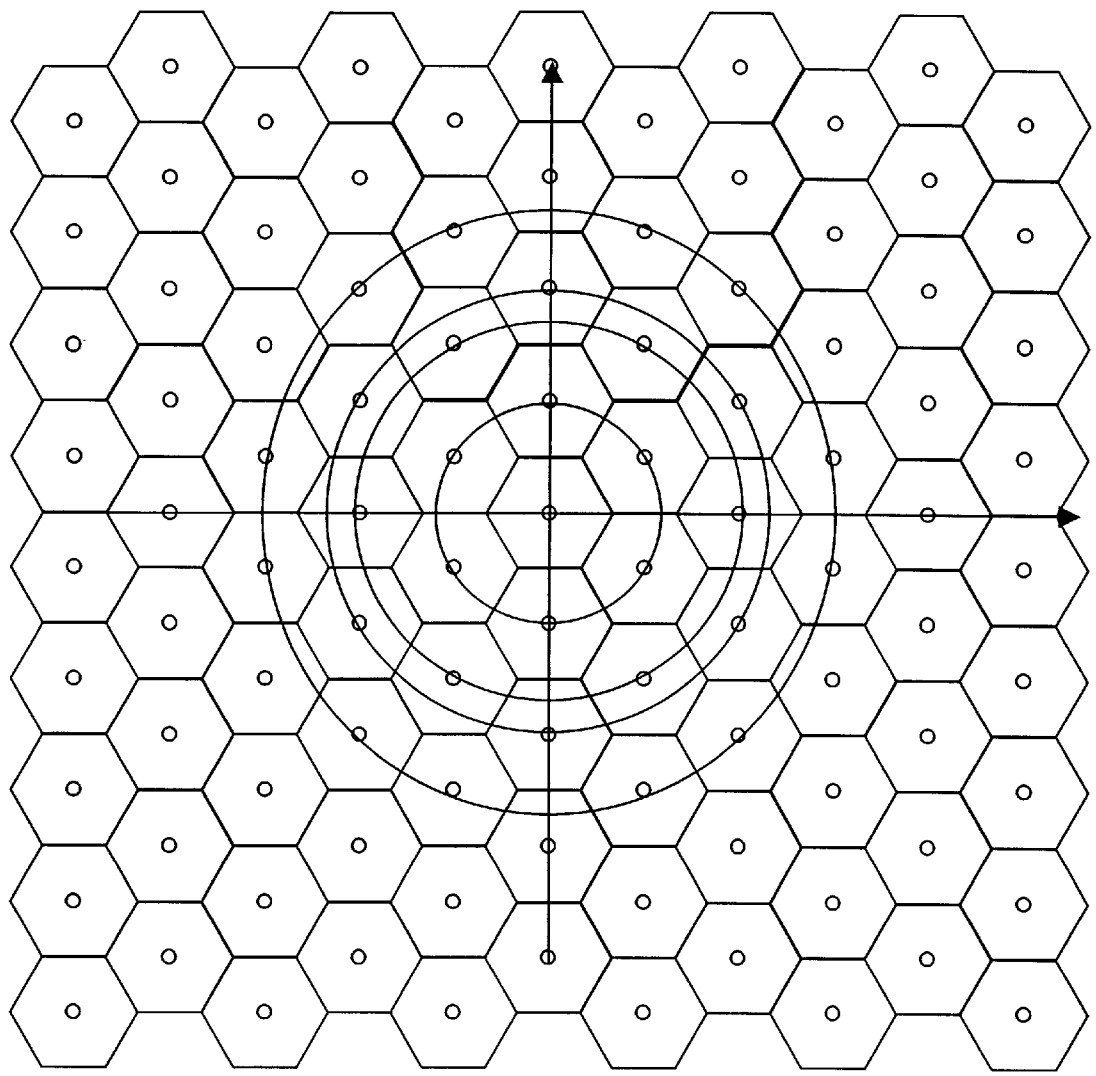
FIG. 4 depicts a code vector lattice in 2 dimensions.

The lattice is preferably chosen so as to be as compact as possible, so as to make the quantization optimal. The lattice is thus for example a so-called $D_n$ lattice, where n is the dimension of the space containing the code vectors. FIGS. 3 and 4 depict a two-dimensional lattice, here the lattice $A_2$, or hexagonal lattice. This lattice is used for quantizing vectors with two components.

Once the vector to be coded is quantized by the circuit 3, this circuit supplies the code vector to a coding circuit 4, which performs a coding by multicode, according to which a vector is represented by several parameters, or codes, which are here its norm and an index.

For this purpose, a norm is first of all considered. For example, in FIG. 3, the norm $L_1$, corresponding to the sum of the absolute values of the components of the vector, is envisaged. The vectors which have the same norm $L_1$ are disposed on an isonorm, here the same rhombus in two dimensions, a hyperpyramid in the general case.

In FIG. 4, the norm $L_2$, corresponding to the sum of the squares of the components of the vector, is envisaged. The vectors which have the same norm are disposed on an isonorm, here a circle in two dimensions, a hypersphere in the general case.

A code vector $VC_k$ is consequently represented by a polar representation, here its norm $N_k$ and an index $I_k$ representing its position amongst all the code vectors having the same norm. The index of the code vector is an integer which represents its position on the hyperpyramid or hypersphere, in the case of the norms $L_1$ and $L_2$. The index $I_k$ is between zero and the number M of code vectors situated on the isonorm decreased by one unit.

As a variant, other types of polar representations using three or more parameters can be used within the scope of the invention. For example, the lattice is divided into sectors, to which respective representation codes are allocated. The code vectors are then represented by their sector, their norm and their index.

The present invention relates more particularly to the index $I_k$ of the code vector $VC_k$. The index $I_k$ is calculated from the components of the code vector, as disclosed below with reference to FIG. 7.

The circuit 4 supplies all the norms $N_k$ of the code vectors $VC_k$ used to quantize the image IM to an entropic coding circuit 5, for example a Huffman coding circuit. Other types of coding can be used for coding the norms of the code vectors.

The circuit 4 supplies all the indices $I_k$ of the code vectors $VC_k$ used to quantize the image IM to a coding circuit 6. This circuit in general terms codes one event amongst a known set of events, each event being represented by an integer index.

The coding performed by the circuit 6 is described below with reference to FIG. 8.

The circuits 5 and 6 have respective outputs $5_1$ and $6_1$ connected to a transmission circuit 7.

The transmission circuit 7 transmits the coded image in a conventional fashion to a receiving device disclosed below. The circuit 7 includes notably circuits for modulating the signal to be transmitted.

As a variant, the transmission circuit is replaced by a circuit for storing the coded image.

Figure 5:
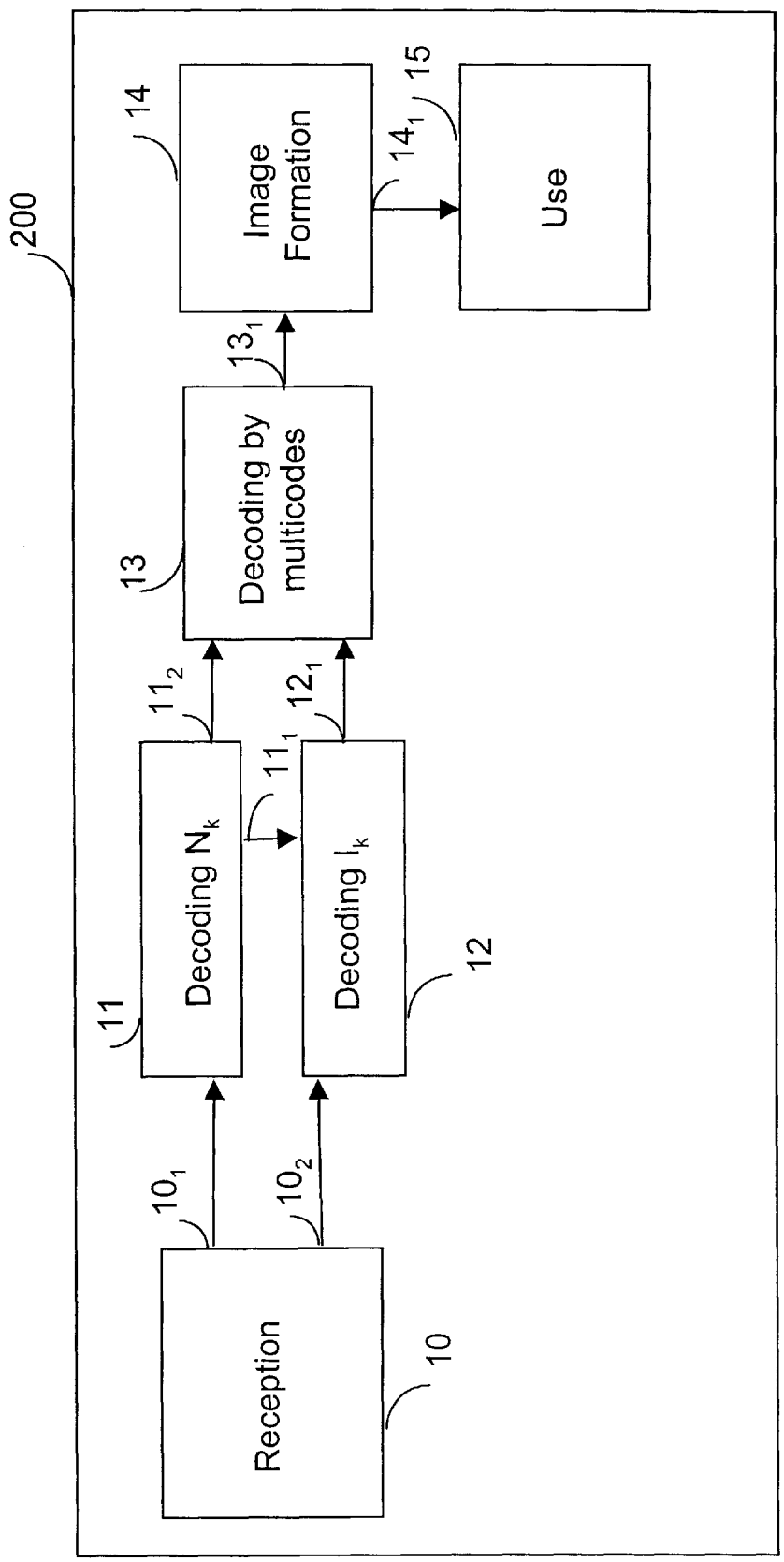
FIG. 5 depicts a block diagram of an embodiment of a digital signal decoding device according to the invention.

With reference to FIG. 5, the decoding device overall performs operations which are the inverse of those of the coding device. The decoding device is integrated into an apparatus 200, which is for example a digital image reader, or a digital video sequence reader, or a data base management system, or again a computer.

One and the same apparatus may include both the coding device and the decoding device according to the invention, so as to perform coding and decoding operations.

The decoding device has a coded data source 10 which includes for example a receiving circuit associated with a buffer memory.

A first output $10_1$ of the circuit 10 is connected to a circuit 11 for decoding the norm $N_k$ of each of the code vectors of a coded image. The circuit 11 performs a decoding corresponding to the coding of the circuit 5. A first output $11_1$ of the circuit 11 is connected to a circuit 12 for decoding the index $I_k$ of each of the code vectors of the coded image under consideration.

A second output $10_2$ of the circuit 10 is connected to the circuit 12.

The decoding performed by the circuit 12 corresponds to the coding performed by the circuit 6 and will be described below with reference to FIG. 11.

The circuit 11 has a second output $11_2$ connected to a circuit 13 for decoding the multicodes. The circuit 12 has an output $12_1$ connected to the circuit 13. The circuit 11 supplies to the circuit 13 the norm $N_k$ of each of the code vectors $VC_k$ of the coded image, and the circuit 12 supplies the index $I_k$ of each of the code vectors.

From the norm and the index of each of the code vectors $VC_k$ of the coded image, the circuit 13 determines the code vectors $VC_k$ in the lattice. The operation of the circuit 13 corresponds to the coding performed by the circuit 4, and is described below with reference to FIG. 12.

An output $13_1$ of the circuit 13 is connected to an image forming circuit 14. The circuit 13 supplies the decoded code vectors $VC_k$ to the circuit 14. The latter constructs the decoded image and has an output $14_1$ connected to a circuit 15 for using the decoded data, having for example image display means.

According to a preferred embodiment of the invention, the circuits for dividing into vectors 2, for vector quantization 3, for coding 4, 5 and 6, and for transmission 7, all included in the coding device depicted in FIG. 1, are implemented by a microprocessor associated with random access and read-only memories. The read-only memory has a program for coding the image IM, and the random access memory contains registers adapted to record variables modified during the running of the program.

Likewise, the circuits for decoding 11, 12 and 13, for image forming 14 and for using 15, included in the decoding device depicted in FIG. 5, are implemented by a second microprocessor associated with random access and read-only memories. The read-only memory contains a program for decoding the images, and the random access memory contains registers adapted to record variables modified during the running of the program.

Figure 6:
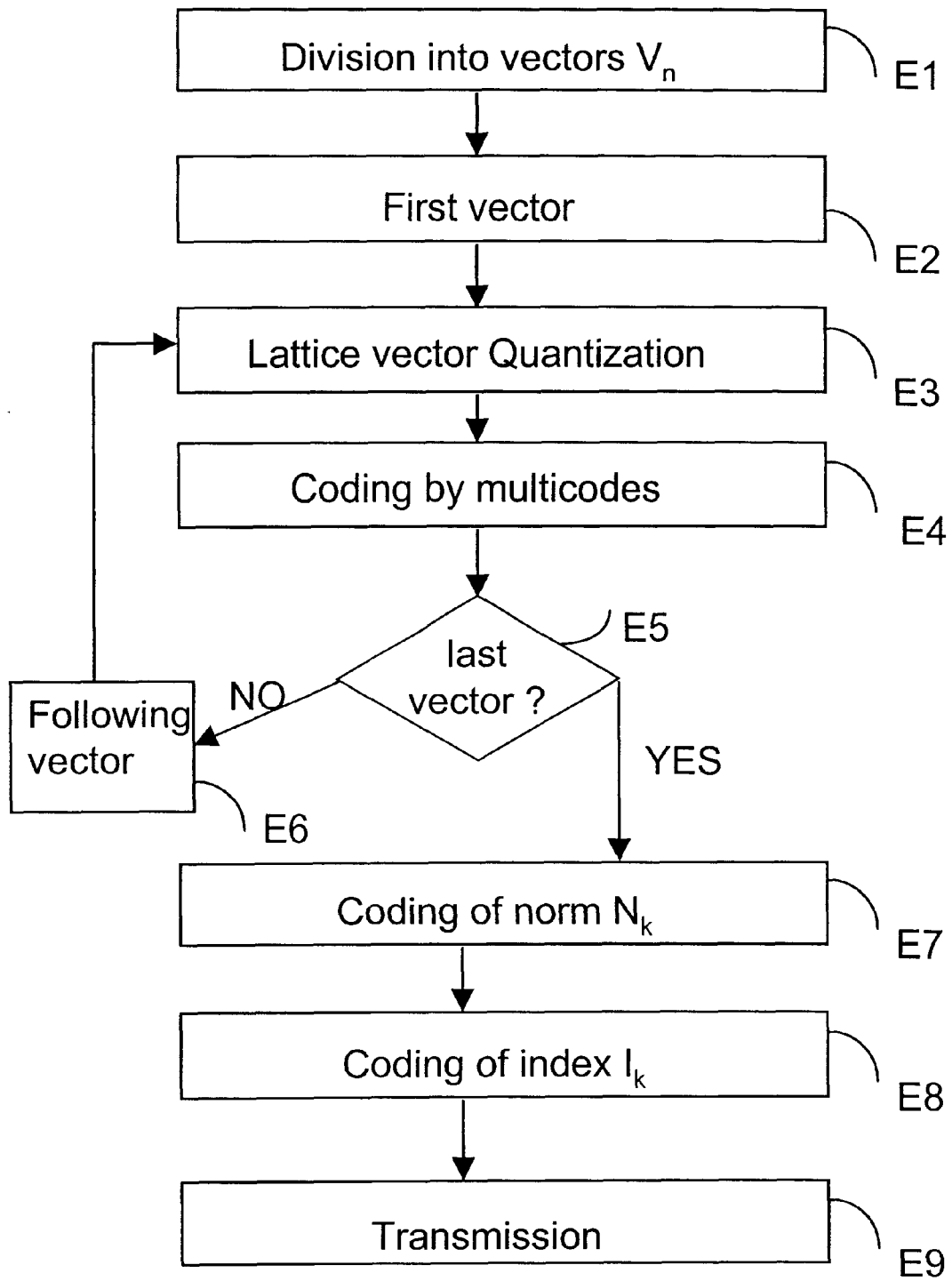
FIG. 6 depicts an embodiment of a digital signal coding algorithm according to the invention.

With reference to FIG. 6, a method of coding an image IM according to the invention, implemented in the coding device, includes steps E1 to E9.

This method is implemented by an algorithm which can be, totally or partially, memorised in any storage medium capable of cooperating with the microprocessor. This storage medium is integrated or can be detachably mountable on the coding device. For example, the storage medium is a floppy disk, or a CD-ROM.

Figure 2B:
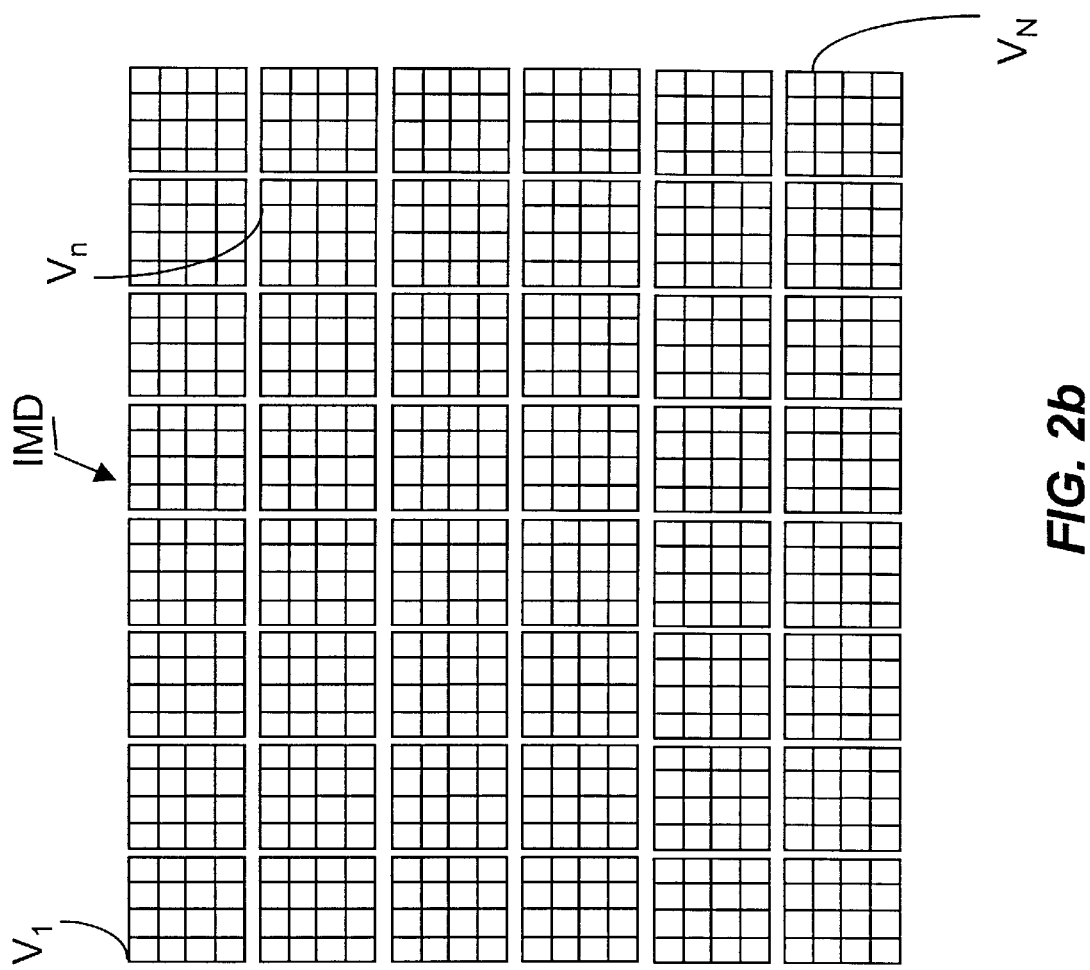
Figure 2A:
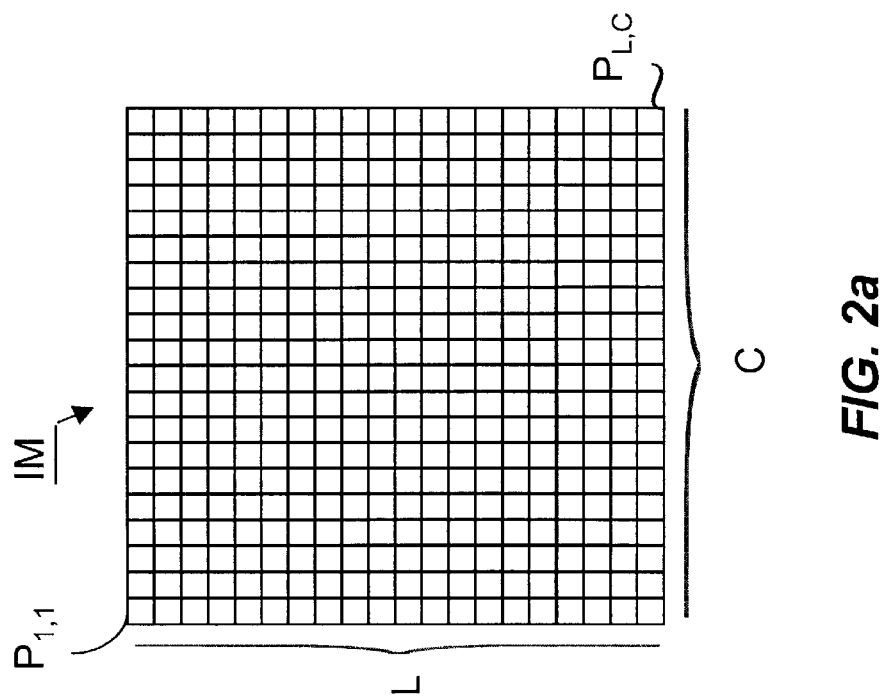

Step E1 is the division of the image to be coded into vectors $V_n$, as depicted in FIG. 2b.

The following step E2 is an initialisation for considering the first vector to be coded. The vectors are processed in an order which can a priori be arbitrary, but predetermined. Step E2 is followed by step E3, which is the lattice vector quantization of the current vector to be coded $V_n$. The result of this step is a code vector $VC_k$ selected in the lattice under consideration.

The following step E4 is the coding by multicode of the code vector $VC_k$ selected at the previous step. This step results in the norm $N_k$ and the index $I_k$ of the code vector $VC_k$. The norm $N_k$ is calculated in a conventional fashion.

The index $I_k$ is an integer which represents the position of the code vector on an isonorm. The index $I_k$ lies between zero and the number of code vectors situated on the same isonorm decreased by one unit. The step E4, with the calculation of the index $I_k$ for a code vector with four components, is disclosed in detail with reference to FIG. 7.

Step E4 is followed by step E5, which is a test for checking whether the current vector $V_n$ is the last of the image currently being coded.

When the response is negative, the step E5 is followed by the step E6 in order to consider the following vector to be coded. The step E6 is followed by the previously described step E3.

When all the vectors to be coded $V_n$ have been processed, the step E5 is followed by the step E7 of coding the norm of each of the code vectors $VC_k$ used for coding the image currently being processed.

As disclosed above, the coding of the norm of the code vectors is an entropic coding, for example a Huffman coding.

The following step E8 is the coding of the indices $I_k$ of each of the code vectors. The step E8 is described in detail in FIG. 8.

The following step E9 is the transmission of the coded forms of the code vectors.

It should be noted that the order of the steps previously described can be modified. Thus the steps E7, E8 and E9 can be performed between the steps E4 and E5. For coding the norm $N_k$, a predetermined entropic coding will then be used.

Figure 7:
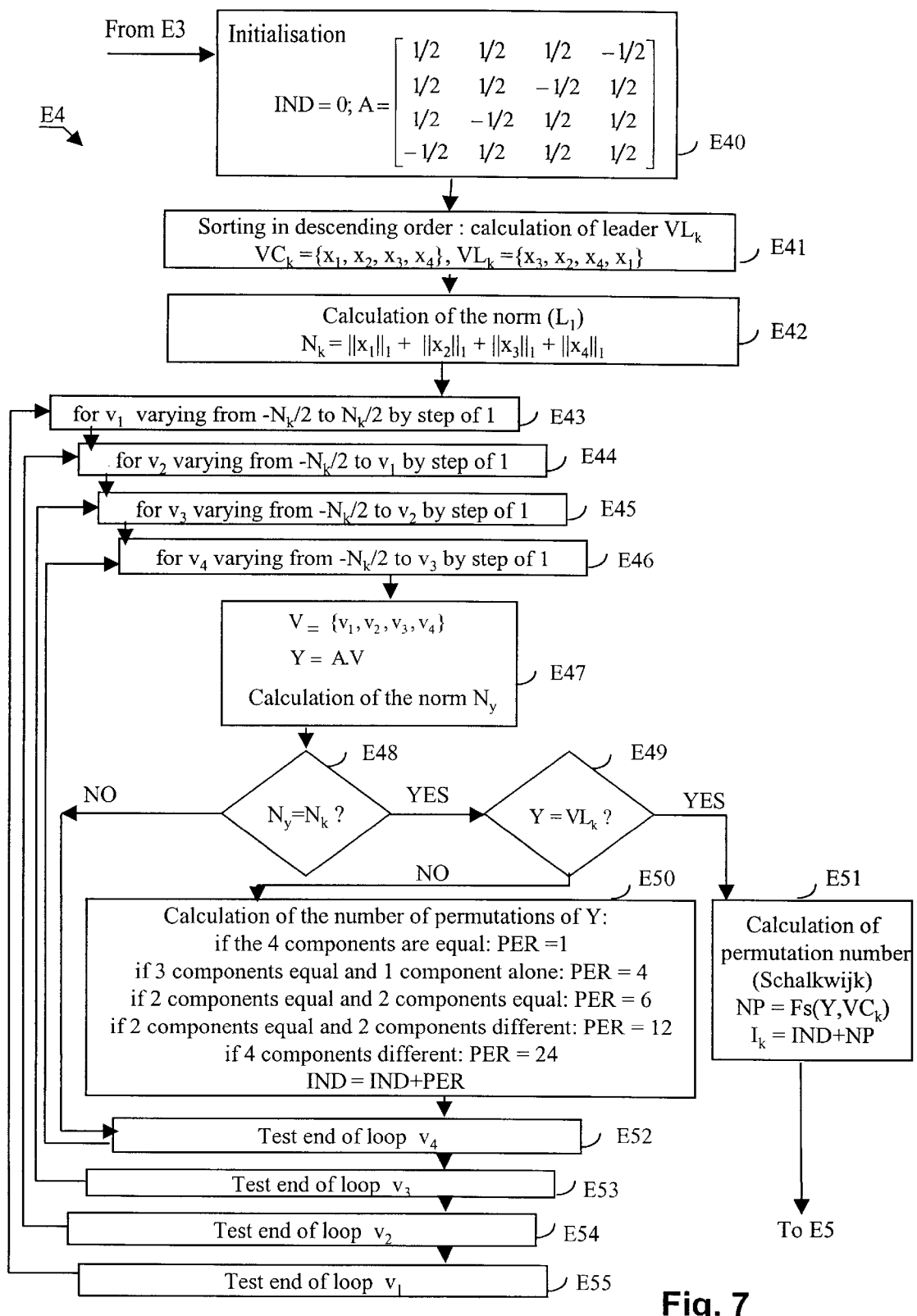
FIG. 7 depicts an embodiment of a code vector coding algorithm, according to the invention, included in the algorithm of FIG. 6.

FIG. 7 depicts the step E4, including the calculation of the norm $N_k$ and the calculation of the index $I_k$ of a code vector, in the case of a code vector with four components. These calculations are depicted in the form of an algorithm including steps E40 to E55.

The code vector $VC_k$, having four components denoted $(x_1, x_2, x_3, x_4)$, is considered.

The step E40 is an initialisation during which a working parameter IND is initialised to the nil value, and a matrix A is considered. The matrix A is a square matrix whose size, here 4×4, depends on the number of components of the code vector considered, and all the coefficients of which are equal to ½, except those of a diagonal, which are equal to –½. The function of the matrix A is to reduce the space for seeking the index $I_k$.

The following step E41 is the determination of the leader vector $VL_k$ of the code vector under consideration $VC_k$. The leader vector $VL_k$ is the vector whose components are those of the code vector under consideration, re-ordered in descending order. For example, the components of the leader vector are $(x_3, x_2, x_4, x_1)$. The leader vector is situated on the isonorm to which the code vector under consideration belongs.

The following step E42 is the calculation of the norm of the code vector $VC_k$. The norm chosen is for example the norm $L_1$. In a variant, another norm can be used, for example the norm $L_2$.

From the following step E43, a search vector V is considered, whose components are $(v_1, v_2, v_3, v_4)$.

The steps E43 to E46 and E52 to E55 form interlaced loops during which the component $v_1$ varies between the value $-N_k/2$ and $N_k/2$, the component $v_2$ varies between $-N_k/2$ and $v_1$, the component $v_3$ varies between $-N_k/2$ and $v_2$ and the component $v_4$ varies between $-N_k/2$ and $v_3$, so as to comply with a descending order of the components of the search vector V. Thus the vector V is in the form of a leader vector. At each step, the pitch of the variations is one unit.

The step E47 is the formation of the current search vector V, with the components determined by the previous steps E43 to E46. An intermediate vector Y is formed, by multiplying the matrix A with the current search vector V. The intermediate vector Y is also a leader vector. The norm $N_Y$ of the intermediate vector Y is determined.

The following step E48 is a test for determining whether the norm $N_Y$ of the intermediate vector Y is equal to that of the code vector $VC_k$. If the response is negative, this means that the intermediate vector Y is not situated on the isonorm to which the code vector $VC_k$ belongs. This vector Y is no longer considered, and the step E48 is followed by the step E52, in order to continue the looping on the component $v_4$.

If the response at step E48 is positive, this means that the vector Y under consideration is situated on the isonorm to which the code vector $VC_k$ belongs. The step E48 is followed by the step E49, during which a test is carried out to determine whether the intermediate vector Y is equal to the leader vector $VL_k$.

If the response is negative, the step E49 is followed by the step E50, at which the number PER of possible permutations of the components of the intermediate vector Y is determined, resulting in the formation of different vectors. This number depends on the one hand on the number of components to be permuted, and on the other hand on the number of these components which are equal to each other. Thus, for four components, the number PER can take five different values, between 1 and 24, according to the number of equal components.

The value of the parameter IND is increased by the number PER.

The step E50 is followed by the step E52 in order to continue the looping.

When the response is positive at step E49, this means that the steps E43 to E49 have resulted in finding the leader vector $VL_k$ of the code vector $VC_k$. This step is followed by the step E51, at which there is determined a permutation number NP between the code vector $VC_k$ and the leader vector $VL_k$, equal to the vector Y.

The permutation number NP is determined by a method known per se, for example by applying the Schalkwijk method, which is described in the article "Algorithm for source coding", which appeared in IEEE Transactions on Information Theory, May 1972, No 3, pages 395 to 399. The index $I_k$ is equal to the parameter IND increased by the value NP.

The method of determining the index of the code vector is applied whatever the number of components of the code vector under consideration, provided that this code vector comes from a lattice $D_n$, with n any value greater than or equal to two.

Figure 8:
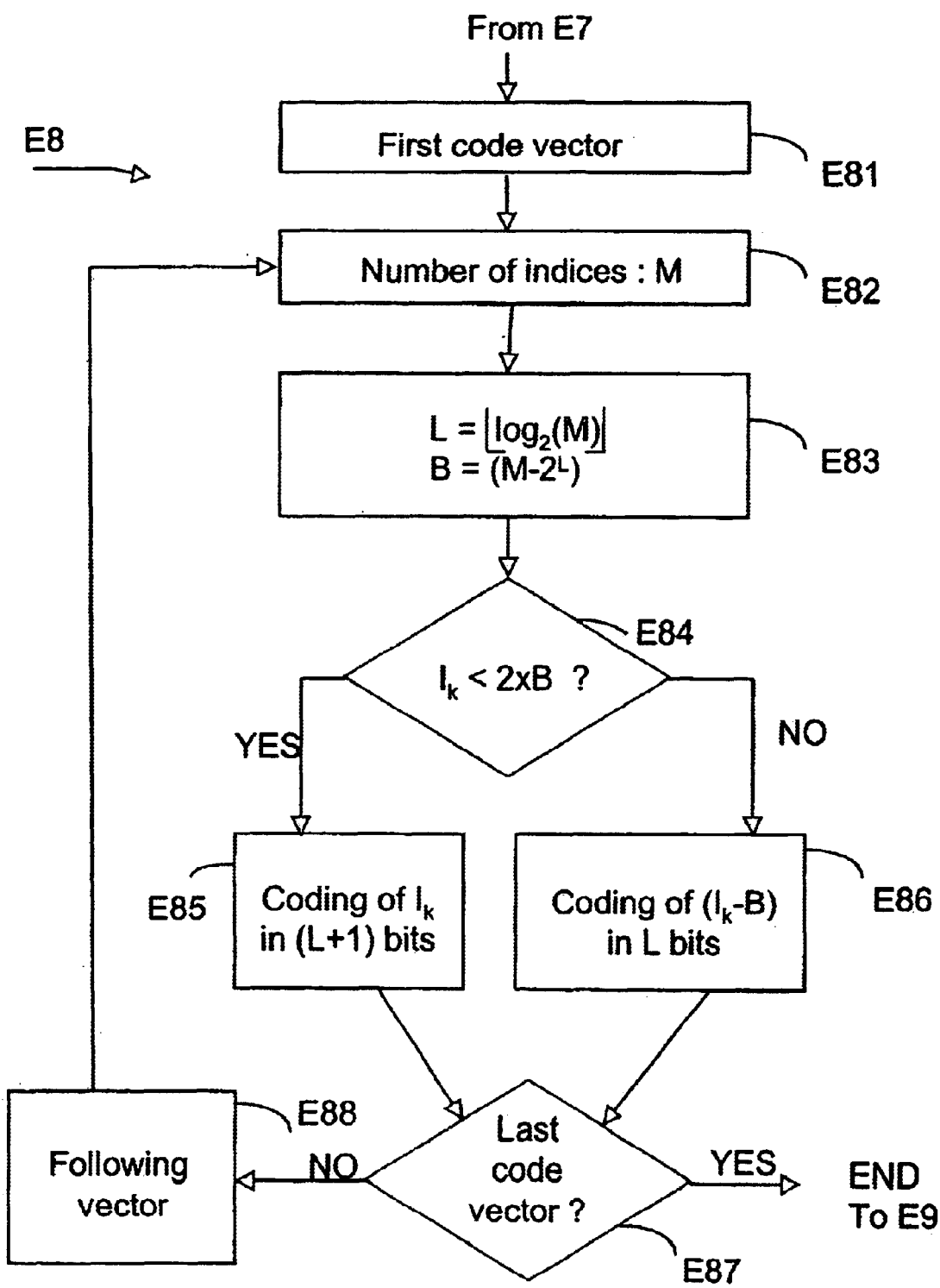
FIG. 8 depicts an embodiment of an index coding algorithm included in the algorithm of FIG. 6.

FIG. 8 depicts the step E8, which is detailed in the form of an algorithm including steps E81 to E88.

The step E81 is an initialisation during which a first code vector $VC_k$ amongst the code vectors used for coding the image IM is considered. The vectors are considered in an arbitrary predetermined order.

The following step E82 is the determination of the number M of code vectors having the same norm as the vector under consideration. The step E82 is followed by the step E83, during which are calculated the numbers $L=\lfloor \log_2(M) \rfloor$ and $B=(M-2^L)$.

The following step E84 is a test for determining whether the index to be coded $I_k$ is less than the quantity 2.B.

If the response is positive, the step E84 is followed by the step E85, at which the index $I_k$ is coded in (L+1) bits.

If the response is negative at step E84, then the latter is followed by step E86, at which the quantity ($I_k$-B) is coded only in L bits.

The events are here assumed to be equiprobable. It should be noted that the invention applies also to a set of non-equiprobable events. In this case, it is possible to allocate the shortest codes to the most probable events.

The steps E85 and E86 are followed by the step E87, which is a test for checking whether the current vector $VC_k$ is the last code vector of the image currently being processed. If the response is negative, the step E87 is followed by the step E88, in order to consider the following code vector. The step E88 is followed by the previously described step E82.

If the response at the step E87 is positive, this means that the coding of the image under consideration is terminated. The step E87 is then followed by the previously described step E9.

FIG. 9a depicts a table summarising the results obtained for 18 events to be coded, each event being represented by an index between 0 and 17. The result of the calculations is:

M=18, L=4, B=2(steps E82 and E83).

A first set of indices includes the indices 0 to 3, which will be coded in 5 bits, and a second set of indices including the indices for which the quantity ($I_k$-B) will be coded in 4 bits.

The coding cost is on average 4.22 bits per event, that is to say, for 10,000 events to be coded, a total cost of approximately 42,222 bits.

It should be noted that, by construction, a coded form of an index is the prefix of no other coded form of another index, which affords a unique decoding of each coded form.

By way of comparison, FIG. 9b depicts the coding of 18 events represented by indices between 0 and 17, using the powers of two. Five bits per event are necessary, that it to say, for 10,000 events, a total of 50,000 bits.

Figure 10:
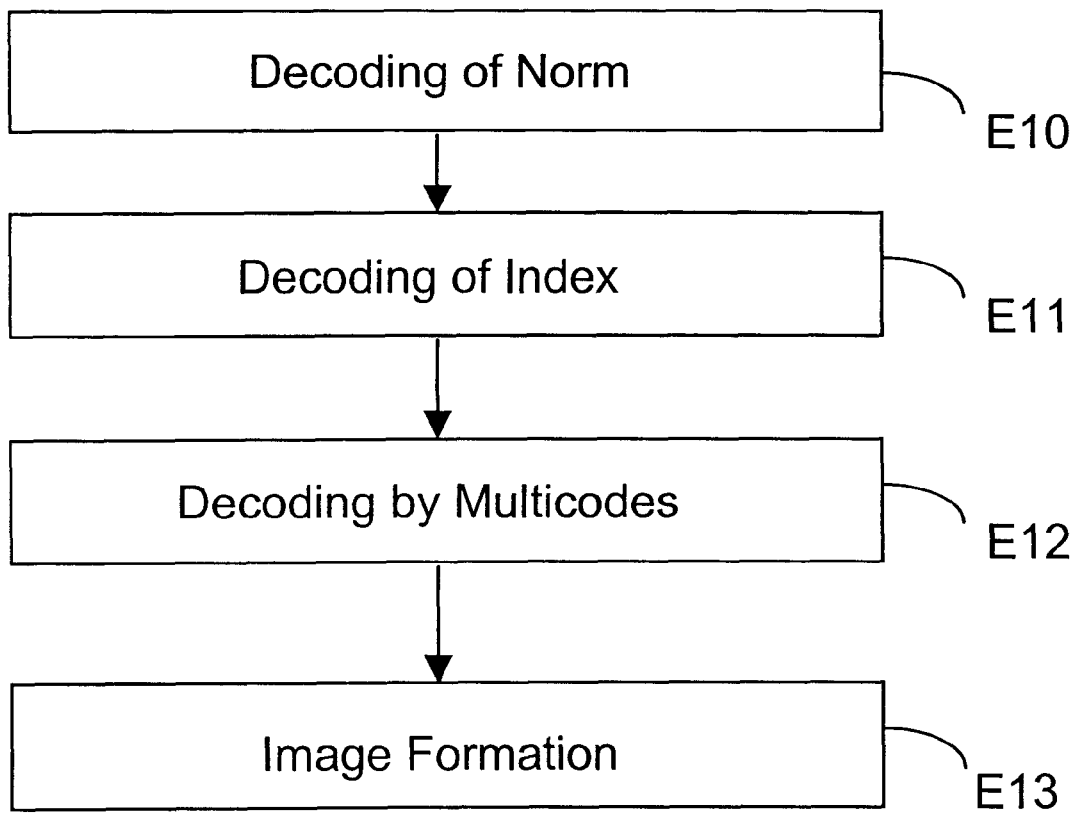
FIG. 10 depicts an embodiment of a digital signal decoding algorithm according to the invention.

With reference to FIG. 10, a method of decoding an image IM according to the invention, implemented in the decoding device, is depicted in the form of an algorithm including steps E10 to E13.

This method is implemented by an algorithm which can be, totally or partially, memorised in any storage medium capable of cooperating with the microprocessor. This storage medium is integrated or can be detachably mountable on the decoding device. For example, the storage medium is a floppy disk, or a CD-ROM.

The step E10 is the decoding of the norm $N_k$ of each of the code vectors $VC_k$ used for coding the image under consideration. The decoding depends on the coding performed, for example an entropic coding.

The following step E11 is the decoding of the index $I_k$ of each of the code vectors $VC_k$. For a code vector under consideration, the norm $N_k$ indicates on which isonorm the vector is situated, and its index $I_k$ enables its exact position on the isonorm to be found. The step E11 is detailed with reference to FIG. 11.

The following step E12 is the determination of the components of each of the code vectors according to its norm and its index. The components of a vector are equal by construction to the values of the pixels of the vector. The vectors are stored to memory.

This step is overall the inverse of step E4, and is detailed with reference to FIG. 12.

The following step E13 is the use of the decoded data, here the formation of the decoded image.

Figure 11:
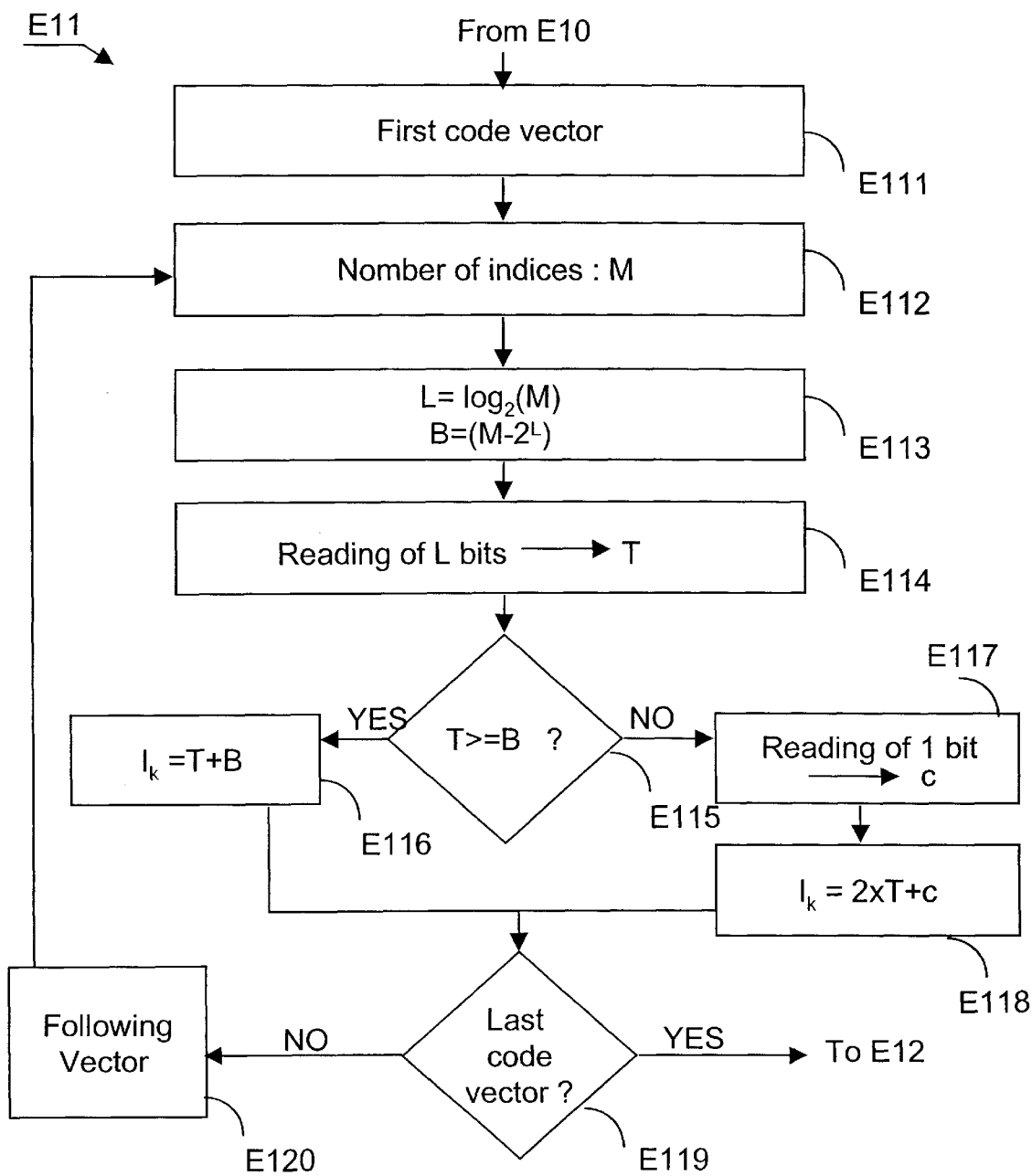
FIG. 11 depicts an embodiment of an index decoding algorithm included in the algorithm of FIG. 10.

FIG. 11 depicts the step E11 in the form of an algorithm including steps E111 to E120.

Step E111 is an initialisation for considering the first code vector of the image to be decoded. The vectors are processed in an arbitrary predetermined order.

The following step E112 is the determination of the number M of code vectors having the same norm as the code vector under consideration. The norm under consideration is the same as at coding.

The following step E113 is the calculation of the quantities $L=\lfloor \log_2(M) \rfloor$ and $B=(M-2^L)$.

The step E113 is followed by the step E114, which is the reading of L bits of the bit stream containing the indices. The value of these L bits is allocated to a working variable T.

The following step E115 is a comparison of the value of T with the value of the quantity B. If the quantity T is greater than or equal to the quantity B, then the step E115 is followed by the step E116, which is the allocation of the value (T+B) to the index $I_k$ of the code vector under consideration.

If at the step E115 the quantity T is less than the quantity B, then the step E115 is followed by the step E117, at which a supplementary bit is read in the bit stream. The value of this bit is allocated to a working variable c.

The following step E118 is the allocation of the value (2.T+c) to the index $I_k$ of the code vector under consideration.

The steps E116 and E118 are followed by the step E119, which is a test for verifying whether the code vector currently being processed is the last code vector of the image to be decoded.

If the response is negative, then the step E119 is followed by the step E120 in order to consider the following code vector. The step E120 is followed by the previously described step E112.

When all the vectors of the image have been processed, then the step E119 is followed by the step E12.

Figure 12:
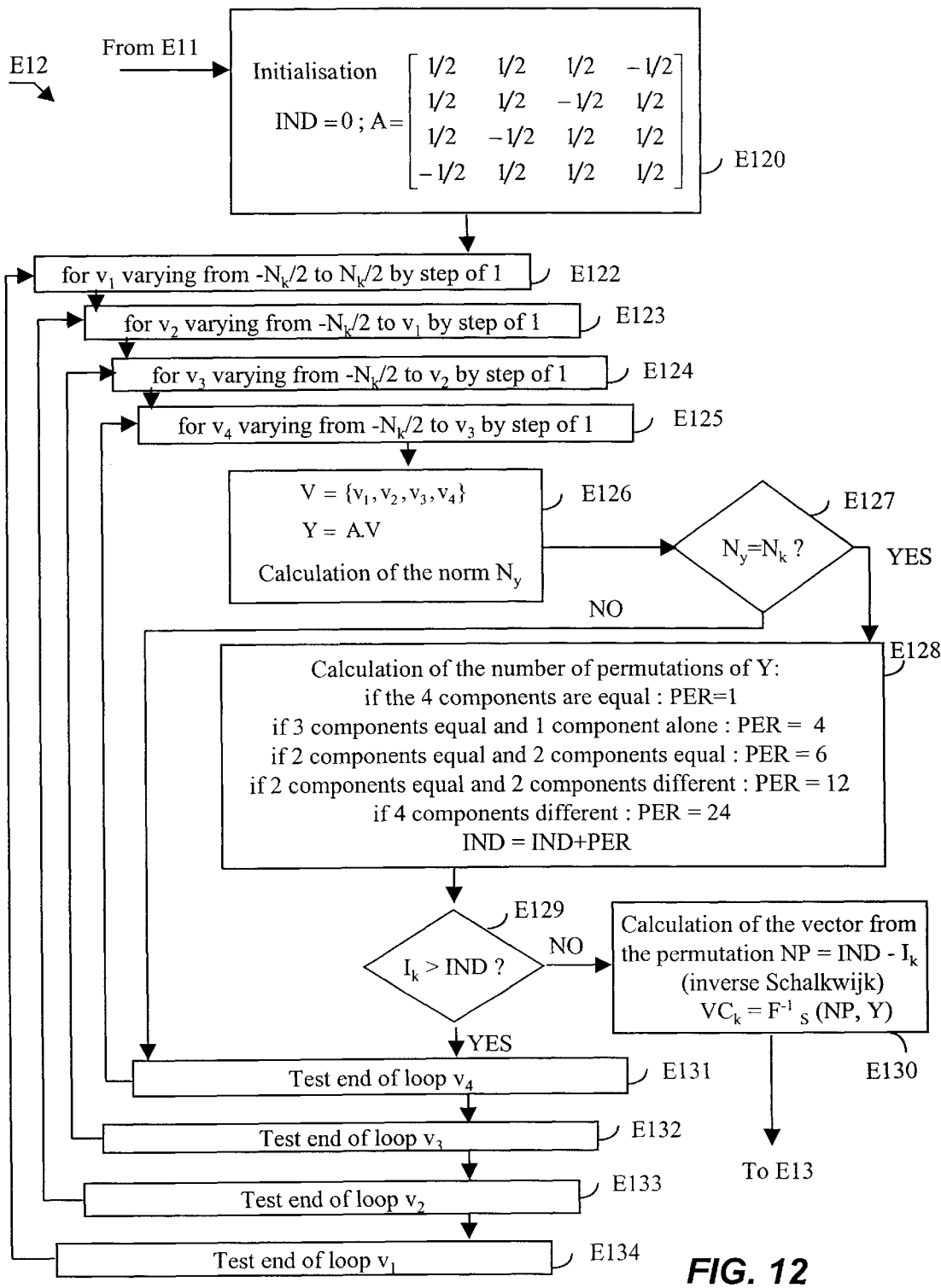
FIG. 12 depicts an embodiment of a code vector decoding algorithm, according to the invention, included in the algorithm of FIG. 10.

FIG. 12 depicts the step E12 in the form of an algorithm including steps E120 to E134. What is envisaged here is only one vector to be decoded, whose norm $N_k$ and index $I_k$ are known from the steps E10 and E11.

The step E120 is an initialisation during which the working parameter IND is initialised to the nil value, and the matrix A is considered. The matrix A is identical to the matrix considered at coding (FIG. 7), namely a square matrix whose size, here 4×4, depends on the number of components of the code vector considered, and for which all the coefficients are equal to ½, except those of a diagonal, which are equal to -½.

As from the following step E122, a search vector V is considered, whose components are ($v_1$, $v_2$, $v_3$, $v_4$).

Steps E122 to E125 and E131 to E134 form interlaced loops during which the component $v_1$ varies between the value $-N_k/2$ and $N_k/2$, the component $v_2$ varies between $-N_k/2$ and $v_1$, the component $v_3$ varies between $-N_k/2$ and $v_2$ and the component $v_4$ varies between $-N_k/2$ and $v_3$, so as to comply with a descending order of the components of the search vector V. Thus the vector V is in the form of a leader vector. At each step, the interval of the variations is one unit.

The step E126 is the formation of the current search vector V, with the components determined by the previous steps E122 to E125. An intermediate vector Y is formed, by multiplying the matrix A with the current search vector V. The intermediate vector Y is also a leader vector. The norm $N_Y$ of the intermediate vector Y is determined.

The following step E127 is a test for determining whether the norm $N_Y$ of the intermediate vector Y is equal to that of the code vector $VC_k$. If the response is negative, this means that the intermediate vector Y is not situated on the isonorm to which the code vector $VC_k$ belongs. This vector Y is no longer considered, and the step E127 is followed by the step E131 in order to continue the looping on the component $v_4$.

If the response at the step E127 is positive, this means that the vector Y considered is situated on the isonorm to which the code vector $VC_k$ belongs. The step E127 is followed by the step E128, at which the number PER of possible permutations of the components of the intermediate vector Y is considered, leading to the formation of different vectors. This number depends on the one hand on the number of components to be permuted, and on the other hand on the number of these components which are equal to each other. Thus, for four components, the number PER can take five different values, between 1 and 24, as a function of the number of equal components.

The value of the parameter IND is increased by the number PER.

The following step E129 is a test for verifying whether the index $I_k$ is strictly greater than the current value of the parameter IND.

If the response is positive, the step E129 is followed by the step E131 in order to continue the looping.

If the response at the step E129 is negative, this step is followed by the step E130, at which the permutation number NP between the code vector $VC_k$ and the leader vector $VL_k$, equal to the vector Y, is determined.

The permutation number NP is equal to the parameter IND decreased by the index $I_k$.

The code vector is determined by a method which is the inverse of the method used at the step E51, here by applying the inverse Schalkwijk method.

The step E130 is followed by the previously described step E13.

A description will now be given of a second embodiment of the invention, with the help of FIGS. 13 to 20.

Figure 13:
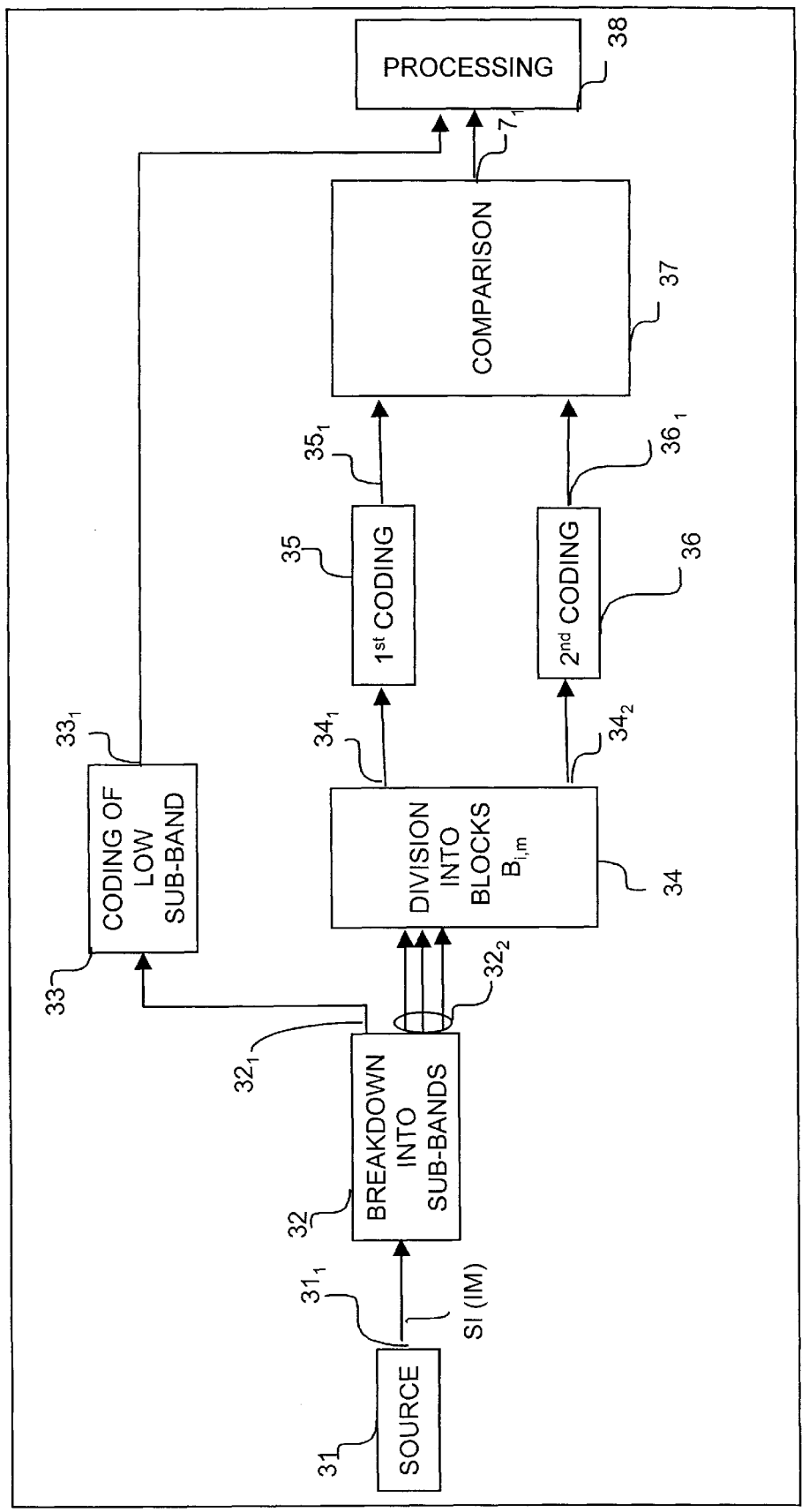
FIG. 13 is a block diagram of a second embodiment of a digital signal coding device according to the invention.
Figure 14:
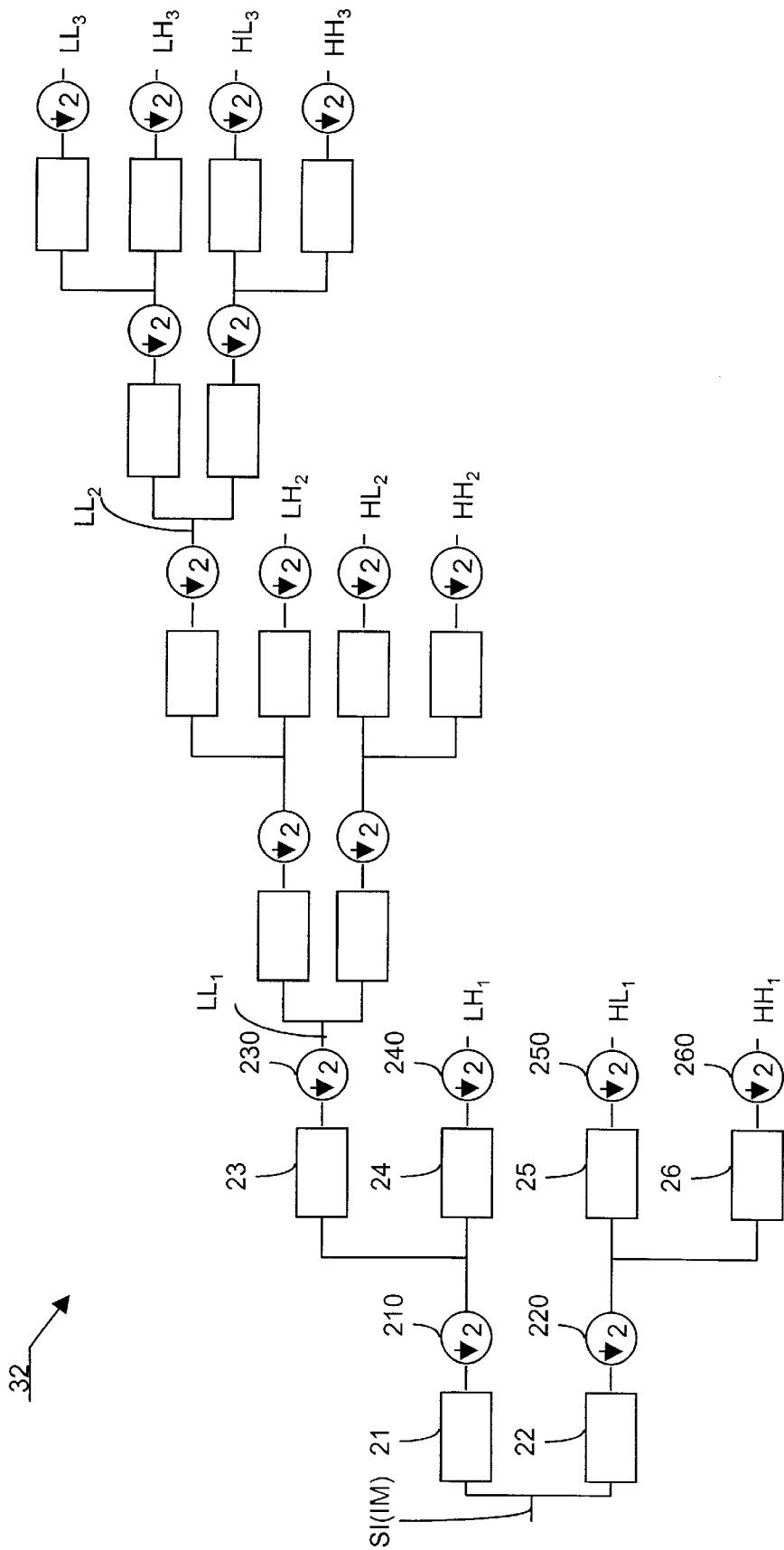
FIG. 14 is a circuit for breaking down into frequency sub-bands, included in the device of FIG. 13.

According to the embodiment chosen and depicted in FIG. 13, a coding device according to the invention is designed to code a digital signal for the purpose of compressing it. The coding device is integrated into an apparatus 300, which is for example a digital photographic apparatus, or a digital camcorder, or a data base management system, or again a computer.

The digital signal to be compressed SI is in this particular embodiment a series of digital samples representing an image.

The device has a signal source 31, here an image signal source. In general terms, the signal source either contains the digital signal, and is for example a memory, a hard disk or a CD-ROM, or converts an analogue signal into a digital signal, and is for example an analogue camcorder associated with an analogue to digital converter. An output $31_1$ of the signal source is connected to an analysis circuit, or circuit for breaking down into sub-bands 32. The circuit 32 has a first output $32_1$ connected to a coding circuit 33.

Second outputs $32_2$ of the breakdown circuit 32 are connected to a circuit for dividing into blocks 34. The circuit 34 has first outputs $34_1$ connected to a first coding circuit 35 and second outputs $34_2$ connected to a second coding circuit 36.

An output $35_1$ of the circuit 35 and an output $36_1$ of the circuit 36 are connected to a comparison circuit 37, an output $37_1$ of which constitutes the output of the coding device according to the invention. The output $37_1$ is connected to a processing circuit 38, which is for example a transmission circuit, or a memory. An output $33_1$ of the coding circuit 33 is also connected to the processing circuit 38.

The image source 31 is a device for generating a series of digital samples representing an image IM. The source 31 has an image memory and supplies a digital image signal SI to the input of the breakdown circuit 32. The image signal SI is a series of digital words, for example bytes. Each byte value represents a pixel of the image IM, here with 256 grey levels, or black and white image.

The circuit for breaking down into sub-bands 32, or analysis circuit, is a conventional set of filters, here respectively associated with decimators by two, which filter the image signal in two directions, into sub-bands of high and low spatial frequencies. According to FIG. 14, the circuit 32 has three successive analysis units for breaking down the image IM into sub-bands according to three resolution levels. It should be noted that the invention does not necessarily imply a breakdown according to several resolution levels, but only a breakdown of the signal to be coded into several sub-bands.

In general terms, the resolution of a signal is the number of samples per unit length used to represent this signal. In the case of an image signal, the resolution of a sub-band is related to the number of samples per unit length for representing this sub-band. The resolution depends on the number of decimations performed.

The first analysis unit receives the digital image signal and applies it to two digital filters, respectively low pass and high pass 21 and 22, which filter the image signal in a first direction, for example horizontal in the case of an image signal. After passing through decimators by two 210 and 220, the resulting filtered signals are respectively applied to two low-pass filters 23 and 25, and high pass filters 24 and 26, which filter them in a second direction, for example vertical in the case of an image signal. Each resulting filtered signal passes through a respective decimator by two 230, 240, 250 and 260. The first unit delivers at its output four sub-bands $LL_1$, $LH_1$, $HL_1$ and $HH_1$ of the highest resolution $RES_1$ in the breakdown.

The sub-band $LL_1$ includes the components, or coefficients, of low-frequency in both directions, of the image signal. The sub-band $LH_1$ includes the components of low-frequency in a first direction and of high-frequency in a second direction, of the image signal. The sub-band $HL_1$ includes the components of high-frequency in the first direction and the components of low-frequency in the second direction. Finally, the sub-band $HH_1$ includes the components of high-frequency in both directions.

Each sub-band is an image constructed from the original image, which contains information corresponding to an orientation respectively vertical, horizontal and diagonal of the contours of the image, in a given frequency band.

The sub-band $LL_1$ is analysed by an analysis unit similar to the previous one in order to supply four sub-bands $LL_2$, $LH_2$, $HL_2$ and $HH_2$ with a resolution level $RES_2$ which is intermediate in the breakdown. The sub-band $LL_2$ includes the components of low-frequency in both analysis directions, and is in its turn analysed by the third analysis unit similar to the previous two. The third analysis unit supplies sub-bands $LL_3$, $LH_3$, $HL_3$ and $HH_3$, with the lowest resolution $RES_3$ in the breakdown, resulting from the division of the sub-band $LL_2$ into sub-bands.

Each of the sub-bands of resolution $RES_2$ and $RES_3$ also corresponds to an orientation in the image.

The breakdown performed by the circuit 32 is such that a sub-band of given resolution is divided into four sub-bands of lower resolution and therefore has four times more coefficients than each of the sub-bands of lower resolution.

Figure 16:
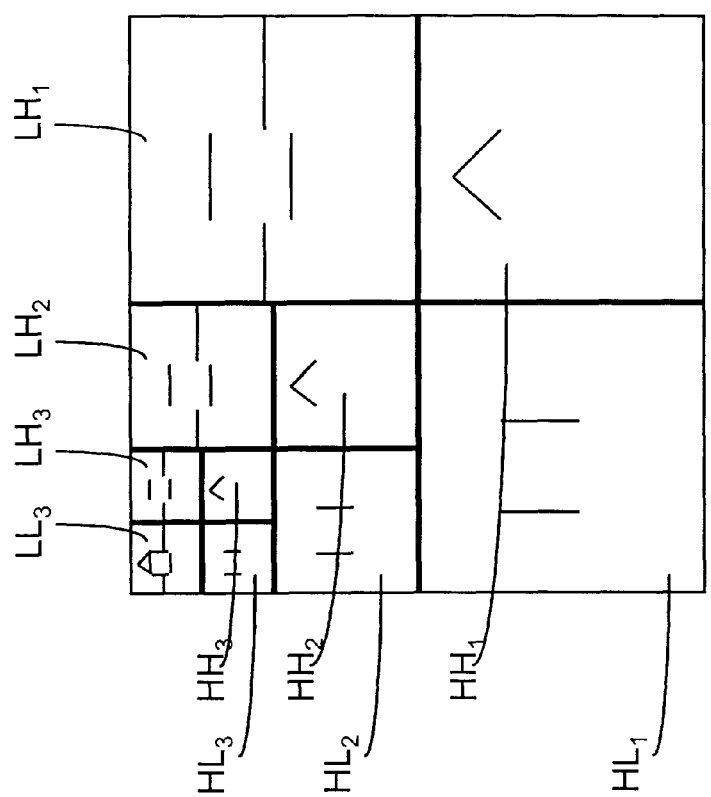
FIG. 16 is an image broken down into sub-bands by the circuit of FIG. 14.
Figure 15:
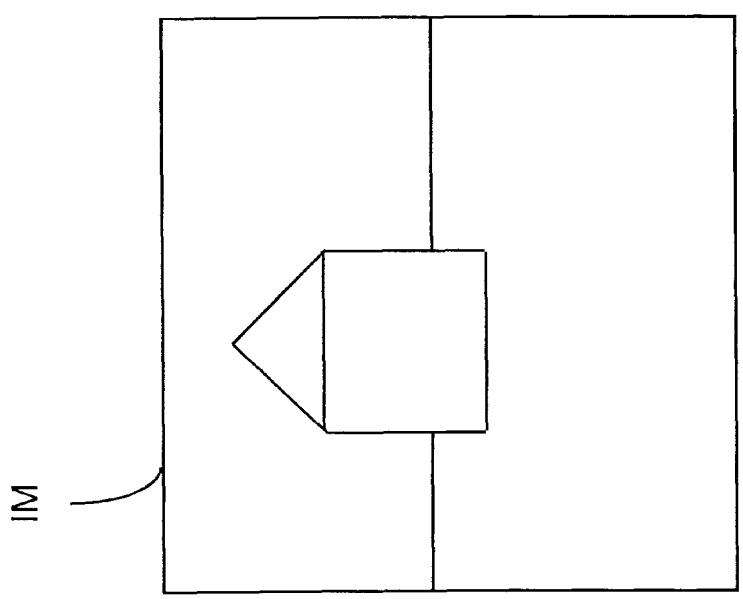
FIG. 15 is a digital image to be coded by the coding device according to FIG. 13.

A digital image IM output from the image source 31 is depicted schematically in FIG. 15, whilst FIG. 16 depicts the image IMD resulting from the breakdown of the image IM, into ten sub-bands according to three resolution levels, by the circuit 32. The image IMD contains as much information as the original image IM, but the information is divided by frequency according to three resolution levels.

The level of lowest resolution $RES_3$ includes the sub-bands $LL_3$, $HL_3$, $LH_3$ and $HH_3$, that is to say the sub-bands of low-frequency according to the two analysis directions. The second resolution level $RES_2$ includes the sub-bands $HL_2$, $LH_2$ and $HH_2$ and the level of highest resolution $RES_1$ includes the sub-bands of highest frequency $HL_1$, $LH_1$ and $HH_1$.

The sub-band $LL_3$ of lowest frequency is a reduction of the original image. The other sub-bands are detail sub-bands.

Naturally, the number of resolution levels, and consequently of sub-bands, can be chosen differently, for example 13 sub-bands and four resolution levels, for a bi-dimensional signal such as an image. The number of sub-bands per resolution level can also be different. The analysis and synthesis circuits are adapted to the dimension of the processed signal.

The sub-band $LL_3$ of lowest resolution $RES_3$ is applied to the coding circuit 33, which codes it into a coded, or compressed, sub-band $LLc_3$.

The coding circuit 33 performs a DPCM (Differential Pulse Code Modulation) coding, which is a coding by linear prediction, with loss. Each pixel of the sub-band to be coded $LL_3$ is predicted according to its neighbours, and this prediction is subtracted from the value of the pixel under consideration, for the purpose of forming a differential "image" which has less correlation between pixels than the original image. The differential image is then quantized and coded by a Huffman coding in order to form the coded sub-band $LLc_3$.

According to other embodiments, the coding circuit 33 performs a coding by discrete cosine transformation (DCT), or by vector quantization.

In all cases, the sub-band of lowest frequency is preferentially processed separately. This is because this sub-band contains a large quantity of information, and it is preferable to code it with the greatest possible precision, without zeroing the unit. However, in order to simplify the implementation, it is possible to code the lowest-frequency sub-band like the detail sub-bands.

The sub-bands $LH_3$, $HL_3$ and $HH_3$, as well as the higher-resolution sub-bands $HL_2$, $LH_2$, $HH_2$, $HL_1$, $LH_1$ and $HH_1$, are supplied to the division circuit 34, in a sub-band order which is a priori arbitrary, but predetermined.

Figure 17:
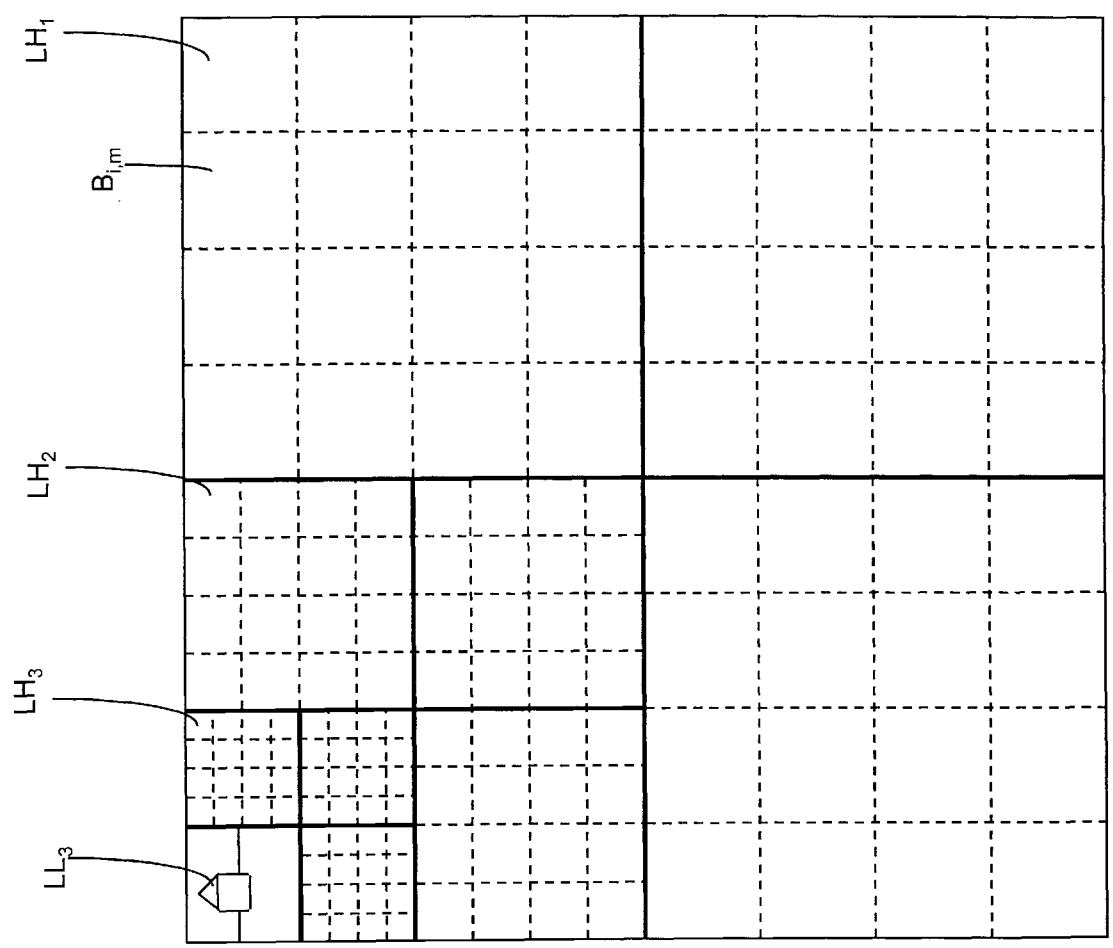
FIG. 17 is an image broken down into sub-bands and then divided into blocks.

As depicted in FIG. 17, the division circuit 34 divides each detail sub-band into blocks. According to the embodiment chosen, all the sub-bands supplied to the circuit 34 are divided into a same number M of blocks $B_{i,m}$, where the index i is an integer, here between 1 and 9, which represents the order of the sub-band in question, and the index m, between 1 and M, is an integer which represents the order of the block in the sub-band in question. The blocks are here square in shape, but can in a variant be rectangular in shape. In general terms, a block is a set of coefficients extracted from the sub-band in order to form a vector.

The order of the blocks is a priori arbitrary, but predetermined. For practical reasons, the blocks are ordered in the same way in all the sub-bands, for example from left to right and from top to bottom.

In consequence of the mode of dividing into blocks, the surface of the blocks is divided by four, passing from the resolution $RES_1$ to the resolution $RES_2$, and from the resolution $RES_2$ to the resolution $RES_3$.

This division is simple to implement, since all the sub-bands are divided into the same number of blocks. However, for implementing the invention, the number and format of the blocks can be different from one resolution to another.

The coding circuit 35 codes each block $B_{i,m}$ supplied by the circuit 34 according to the first coding mode. This mode consists of setting all the coefficients of the block to a predetermined value, for example the value zero. This coding is very economical in numbers of bits, since it entails the transmission or storage of no coding data, and consequently requires a nil transmission rate. However, the coding error may be great if the block under consideration is not of low energy.

The coding circuit 36 codes each block $B_{i,m}$ supplied by the circuit 34 by means of a second coding mode, here by lattice vector quantization. It should be noted that the blocks considered by the second coding mode can be the previously defined blocks $B_{i,m}$, or in a variant blocks $V_n$ of lower size, formed in the blocks $B_{i,m}$.

For each of the blocks, the circuit 37 compares the two codings according to a criterion for selecting the most appropriate coding, according to this criterion, for each block considered. To this end, the circuit 37 determines the rates $R_{1,i,m}$ and $R_{2,i,m}$ necessary for transmitting the block coded by each of the two circuits 5 and 6, as well as the coding errors, or distortion, $D_{1,i,m}$ and $D_{2,i,m}$ caused by the coding performed by each of the two circuits 35 and 36. The errors $D_{1,i,m}$ and $D_{2,i,m}$ here measure respectively the quadratic error imparted to the image reconstructed by the coding of the block in question, according to the first and second coding modes. Where the breakdown into sub-bands is orthogonal, the errors $D_{1,i,m}$ and $D_{2,i,m}$ are equal to the quadratic errors between the original block and the reconstructed block.

The circuit 37 next compares, for each of the blocks, the sums $R_{1,i,m}+\lambda.D_{1,i,m}$ and $R_{2,i,m}+\lambda D_{2,i,m}$, where $\lambda$ is a coefficient for setting the compression/distortion ratio. The coding for which the sum is the lowest is selected, for each of the blocks under consideration.

An indicator $I_{i,m}$ is associated with each of the blocks in order to indicate which is the coding selected by the circuit 37. The indicator $I_{i,m}$ is for example a bit which is set to zero if the block in question is coded by setting to zero, and which is set to one if the block in question is coded by lattice vector quantization.

The circuit 37 transmits to the processing circuit 38 the indicator $I_{i,m}$ of each coded block, associated with the coding data of the block under consideration, where the block under consideration is coded by lattice vector quantization.

Figure 18:
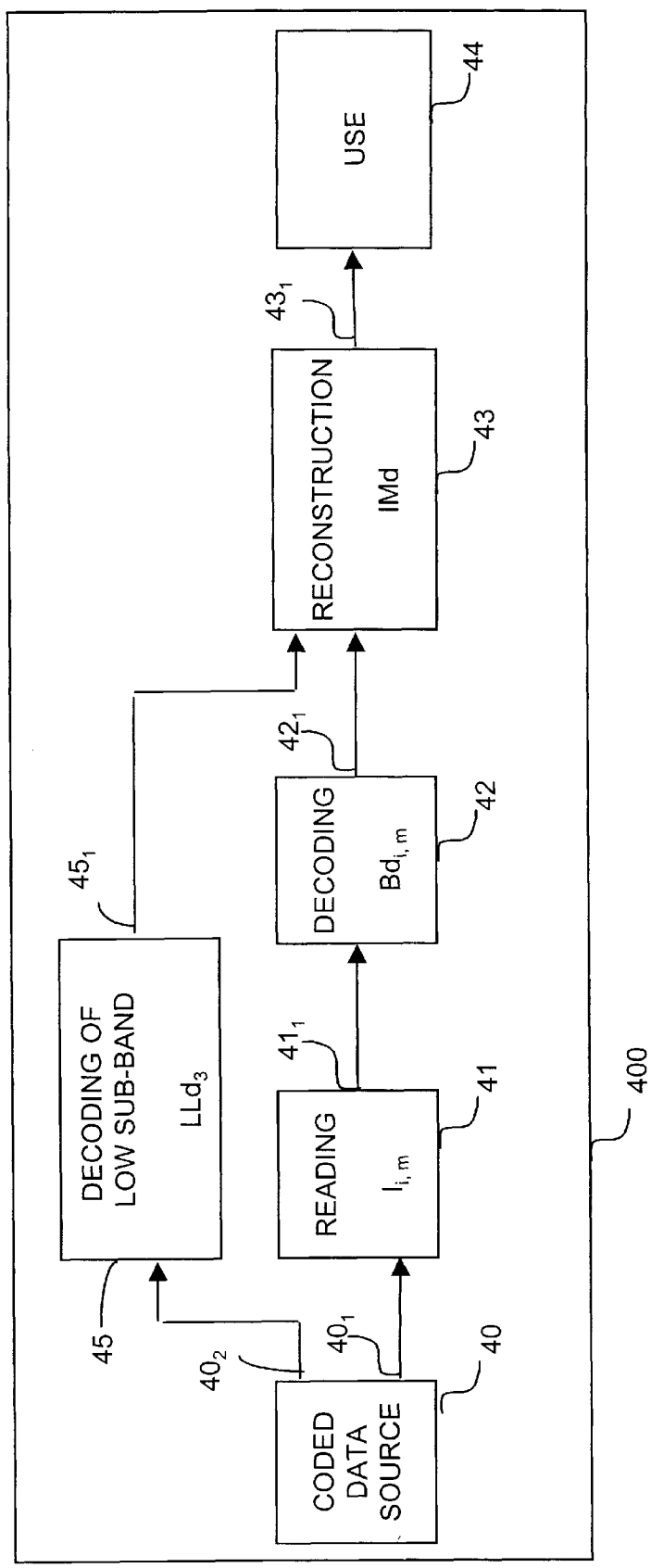
FIG. 18 is a block diagram of a second embodiment of a decoding device according to the invention.

With reference to FIG. 18, the decoding device performs operations overall which are the inverse of those of the coding device. The decoding device is integrated into an apparatus 400, which is for example a digital image reader, or a digital video sequence reader, or a data base management system, or again a computer.

One and the same apparatus may include both the coding device and the decoding device according to the invention, so as to perform coding and decoding operations.

The decoding device has a coded data source 40 which includes for example a receiving circuit associated with a buffer memory.

A first output $40_1$ of the circuit 40 is connected to a circuit 41 of the indicator reader $I_{i,m}$, an output $41_1$ of which is connected to a decoding circuit 42.

The decoding circuit 42 has an output $42_1$ connected to a reconstruction circuit 43. The latter has an output $43_1$ connected to a circuit 44 for using the decoded data, including for example image display means.

The circuit 40 supplies coded data to the circuit 41, which determines the coding mode used for each of the blocks by analysing the indicator $I_{i,m}$.

If the indicator $I_{i,m}$ indicates that the block under consideration is coded by setting to zero, its decoding consists of creating a block, all the coefficients of which are at the value zero. The size of the block created depends on the sub-band currently being decoded, and is for example determined by the index of the block.

If the indicator $I_{i,m}$ indicates that the block in question is coded by lattice vector quantization, the coding data of the block in question are read and decoded, as previously disclosed, by the circuit 42, which forms a decoded block $Bd_{i,m}$.

The circuit 42 supplies the decoded blocks $Bd_{i,m}$ to the reconstruction circuit 43, which is a synthesis circuit corresponding to the analysis circuit 32 described previously, and reconstructs the image IMd corresponding to the decoded sub-bands.

A second output $40_2$ of the circuit 40 is connected to a circuit 45 for decoding the sub-band of lowest frequency, a first output $45_1$ of which is connected to the reconstruction circuit 43.

The decoding circuit 45 performs operations which are the inverse of those of the coding circuit 33, and supplies the decoded sub-band $LLd_3$ to the reconstruction circuit 43.

According to a preferred embodiment of the invention, the circuits for breaking down into sub-bands 32, for coding 33, for dividing into blocks 34, for coding 35 and 36, for comparison 37 and for processing 38, all included in the coding device depicted in FIG. 13, are produced by means of a microprocessor associated with random access and read-only memories. The read-only memory contains a program for coding each of the blocks of data, and the random access memory contains registers adapted to record variables modified during the running of the program.

Likewise, the circuits for reading 41, decoding 42 and 45 and reconstruction 43, included in the decoding device depicted in FIG. 18, are produced by means of a second microprocessor associated with random access and read-only memories. The read-only memory contains a program for decoding each of the blocks of data, and the random access memory contains registers adapted to record variables modified during the running of the program.

Figure 19:
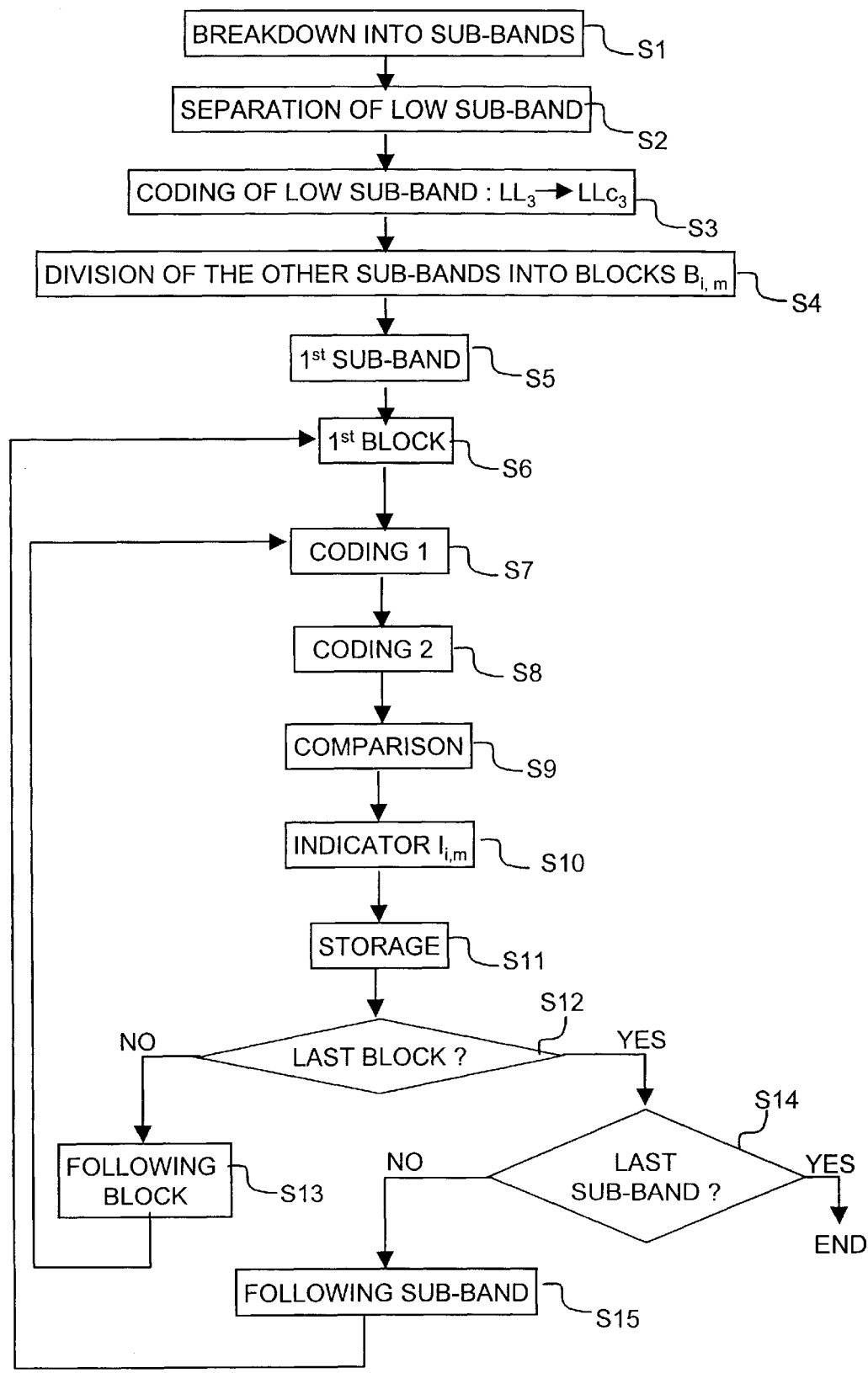
FIG. 19 is a digital signal coding algorithm according to a second embodiment of the invention.

With reference to FIG. 19, a method according to the invention for coding an image IM, implemented in the coding device, includes steps S1 to S15.

This method is implemented by an algorithm which can be, totally or partially, memorised in any storage medium capable of cooperating with the microprocessor. This storage medium is integrated or can be detachably mountable on the coding device. For example, the storage medium is a floppy disk, or a CD-ROM.

Step S1 is the breakdown of the image IM into sub-bands, as depicted in FIG. 16. Step S1 results in the sub-bands $LL_3$, $HL_3$, $LH_3$ and $HH_3$ of lowest resolution $RES_3$, the sub-bands $LH_2$, $HL_2$, $HH_2$ of intermediate resolution $RES_2$, and the sub-bands $LH_1$, $HL_1$ and $HH_1$ of highest resolution $RES_1$.

The sub-band $LL_3$ is separated from the other sub-bands at the following step S2.

The step S3 codes the sub-band $LL_3$ according to a DPCM (Differential Pulse Code Modulation) coding, and results in the coded sub-band $LLc_3$, which is stored and/or transmitted.

The step S3 is followed by the step S4, which is the division of the other sub-bands into blocks $B_{i,m}$, as depicted in FIG. 17.

The following step S5 is an initialisation for considering the first sub-bands. The sub-bands are taken into account in an order which is a priori arbitrary, whilst being predetermined.

The following step S6 is an initialisation for considering the first block of the current sub-band. The blocks of the current sub-band are taken into account in an arbitrary and predetermined order.

Step S6 is followed by step S7, which is the coding, by setting to a predetermined value, here zero, of the coefficients of the current block $B_{i,m}$. The following step S8 is the coding, by a second coding mode, here lattice vector quantization, of the current block $B_{i,m}$.

The following step S9 is the comparison of the two coding modes, for the current block, according to a predetermined criterion. The step S9 results in the selection of one of the coding modes, for the current block $B_{i,m}$.

To this end, the sums $R_{1,i,m}+\lambda.D_{1,i,m}$ and $R_{2,i,m}+\lambda.D_{2,i,m}$ are calculated, where $R_{1,i,m}$ and $R_{2,i,m}$ are the rates necessary for transmitting the current block coded by the two modes, $D_{1,i,m}$ and $D_{2,i,m}$ are the distortions caused in the current block by the two coding modes, and $\lambda$ is a coefficient for setting the compression/distortion ratio. As disclosed above, the errors $D_{1,i,m}$ and $D_{2,i,m}$ measure respectively the quadratic error imparted to the image reconstructed by the coding of the block in question, according to the first and second coding modes. The coding for which the sum is the lowest is selected, for the current block.

At the following step S10, an indicator $I_{i,m}$ is associated with the current block in order to indicate which is the coding selected at step S9. The indicator $I_{i,m}$ is for example a bit which is set to zero if the block in question is coded by setting to zero, and which is set to one if the block under consideration is coded by lattice vector quantization.

The following step S11 is the storage of the value of the indicator $I_{i,m}$ as well as the coded data in cases where the current block is coded by lattice vector quantization.

The steps S12 and S14 are tests for verifying whether respectively all the blocks of a sub-band and all the sub-bands have been coded. If there remains at least one block to be coded in the current sub-band, the step S12 is followed by the step S13 in order to consider the following block. The step S13 is followed by the previously described step S7.

If there remains at least one sub-band to be coded, the step S14 is followed by the step S15 in order to consider the following sub-band. The step S15 is followed by the previously described step S6.

Figure 20:
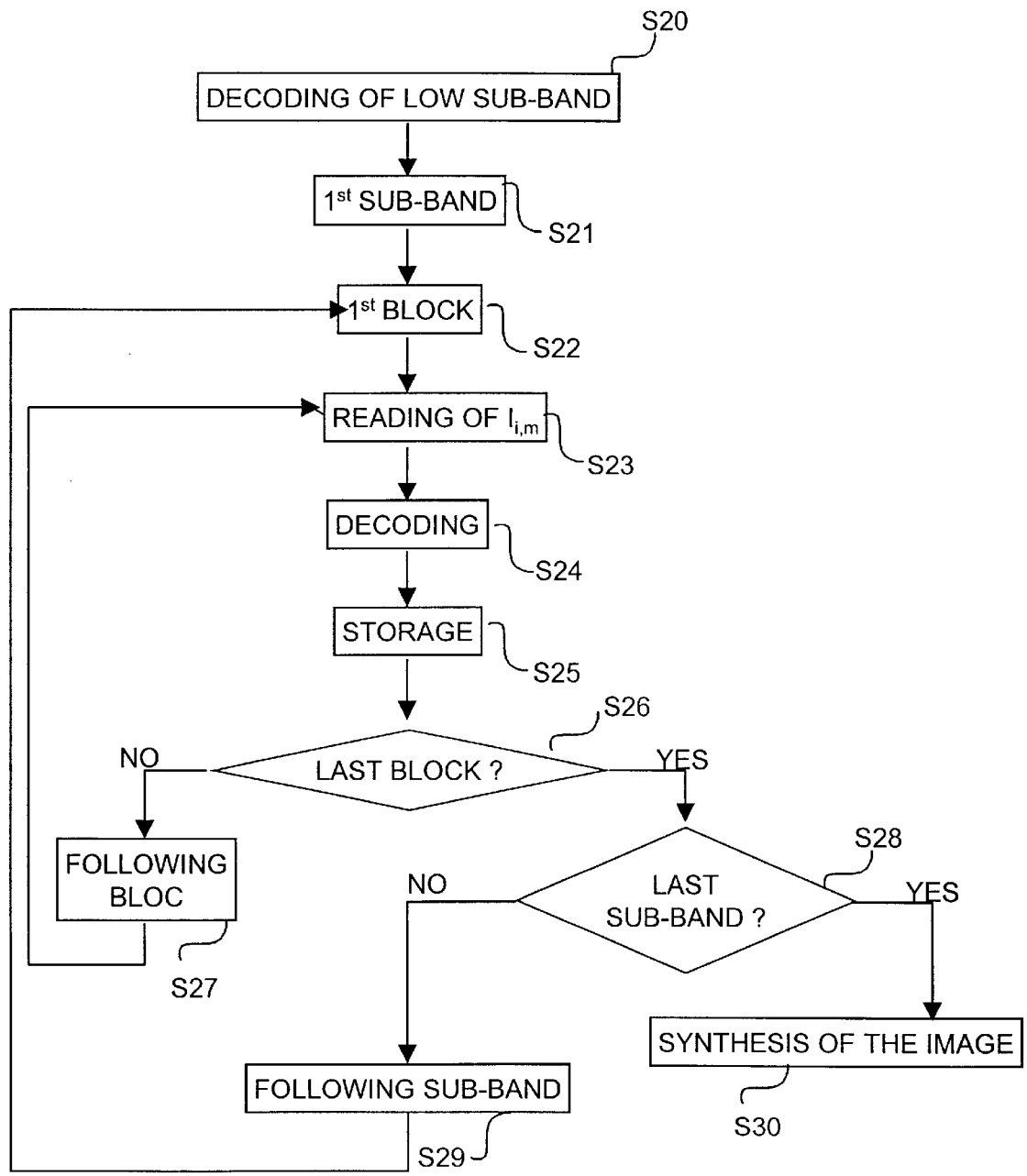
FIG. 20 is a digital signal decoding algorithm according to the second embodiment of the invention.

With reference to FIG. 20, a method according to the invention for decoding an image IM, implemented in the decoding device, comprises steps S20 to S30.

This method is implemented by an algorithm which can be, totally or partially, memorised in any storage medium capable of cooperating with the microprocessor. This storage medium is integrated or can be detachably mountable on the decoding device. For example, the storage medium is a floppy disk, or a CD-ROM.

The step S20 is the decoding of the low sub-band $LLc_3$ in order to form a decoded low sub-band $LLd_3$, which is stored to memory.

The following step S21 is an initialisation for considering the first detail sub-band to be decoded.

The step S21 is followed by the step S22, which is an initialisation for considering the first block to be decoded in the current sub-band. The sub-bands are decoded in the same order as at coding, and the blocks in a given sub-band are decoded in the same order as at coding, although different orders are possible.

The following step S23 is the reading of the indicator $I_{i,m}$ in order to determine which coding mode was used for coding the current block.

The step S23 is followed by the step S24, which is decoding of the current block. If the block has been coded by setting to zero, the decoding consists of creating a block, all the coefficients of which are at the value zero. The size of the block created depends on the sub-band currently being decoded, and is for example determined by the index of the block. If the block has been coded by lattice vector quantization, it is decoded, as disclosed previously, in order to form the decoded block $Bd_{i,m}$.

The decoded block $Bd_{i,m}$ is stored at the following step S25.

The steps S26 and S28 are steps for verifying whether respectively all the blocks of a sub-band and all the sub-bands have been decoded. If there remains at least one block to be decoded in the current sub-band, the step S26 is followed by the step S27 in order to consider the following block. The step S27 is followed by the previously described step S23.

If there remains at least one sub-band to be decoded, the step S28 is followed by the step S29 in order to consider the following sub-band. The step S29 is followed by the previously described step S22.

When all the sub-bands have been decoded, that is to say when the response is positive at step S28, the latter step is followed by the step S30 of constructing the decoded image. The latter can then be displayed, for example.

The invention has been described for a grey-level image; as a variant, the invention applies to a digital colour image. The colour image is a set of pixels respectively defined by their red, green and blue components. Each colour component of a pixel is a binary word, for example a byte. The colour image thus has a structure similar to three grey-level images. The colour image is coded by three parallel coders, similar to the coding device described, each receiving a component of the colour image.

According to another variant, the colour image is defined by its luminance and chrominance. The luminance component and the two chrominance components are coded in parallel by three coders similar to the coding device described.

The invention also applies to other types of colour image, for example defined by intensity, colour and saturation.

Naturally, the present invention is in no way limited to the embodiments described and depicted, but quite the contrary encompasses any variant within the capability of a person skilled in the art.

What is claimed is:

1. A method of coding an index representing a position of a code vector of a code vector dictionary on an isonorm, the index being included in a known group of indices, comprising the steps of:
    determining a first number and a second number of bits which can be used to code an index, as a function of the number of indices in the group,
    determining an even delimiter,
    comparing the index with the delimiter,
    coding the index decreased by half the delimiter, using the first number of bits, if the index is greater than or equal to the delimiter, and
    coding the index using the second number of bits, if the index is less than the delimiter.

2. The method according to claim 1, wherein the determination of the first number of bits includes a calculation of the largest integer which is not larger than the logarithm to the base 2 of the number of indices in the group.

3. The method according to claim 1, wherein the determination of the second number of bits includes the calculation of the largest integer which is not larger than the logarithm to the base 2 of a number of indices in the group increased by one unit.

4. A method of coding an index representing a position of a code vector of a code vector dictionary on an isonorm, the index being included in a known group of indices, comprising the steps of:
    determining a first number and a second number of bits which can be used to code an index, as a function of a number of indices in the group,
    determining a delimiter,
    comparing the index with the delimiter, in order to select the first number of bits or the second number of bits according to the result of the comparison, and
    coding the index by using the first number of bits or the second number of bits according to the result of the selection.

5. The method according to claim 4, further comprising the steps of:
    determining an even delimiter,
    comparing the index with the delimiter,
    coding the index decreased by half the delimiter, using the first number of bits, if the index is greater than or equal to the delimiter, and
    coding the index using the second number of bits, if the index is less than the delimiter.

6. The method according to claim 4, wherein the delimiter depends on the number of indices contained in the group.

7. The method according to claim 4, wherein the determination of the first number of bits includes a calculation of the largest integer which is not larger than the logarithm to the base 2 of the number of indices in the group.

8. The method according to claim 4, wherein the determination of the second number of bits includes a calculation of the largest integer which is not larger than the logarithm to the base 2 of a number of indices in the group increased by one unit.

9. A device for coding an index representing a position of a code vector of a code vector dictionary on an isonorm, the index being included in a known group of indices, comprising:
    means of determining a first number and a second number of bits which can be used for coding an index, as a function of a number of indices in the group,
    means of determining an even delimiter,
    means of comparing the index with the delimiter,
    mean of coding the index decreased by half the delimiter, using the first number of bits, if the index is greater than or equal to the delimiter, and
    means of coding the index using the second number of bits, if the index is less than the delimiter.

10. The device according to claim 9, adapted to determine the first number of bits by calculating the largest integer which is not larger than the logarithm to the base 2 of the number of indices in the group.

11. The device according to claim 9, adapted to determine the second number of bits by calculating the largest integer which is not larger than the logarithm to the base 2 of the number of indices in the group increased by one unit.

12. A device for coding an index representing a position of a code vector of a code vector dictionary on an isonorm, the index being included in a known group of indices, comprising:

means of determining a first number and a second number of bits which can be used for coding an index, as a function of a number of indices in the group, means of determining a delimiter, means of comparing the index with the delimiter, in order to select the first number of bits or the second number of bits according to a result of the comparison, and means of coding the index by using the first number of bits or the second number of bits according to the result of the selection.

13. The device according to claim 12, adapted to determine the first number of bits by calculating the largest integer which is not larger than the logarithm to the base 2 of the number of indices in the group.

14. The device according to claim 12, adapted to determine the second number of bits by calculating the largest integer which is not larger than the logarithm to the base 2 of the number of indices in the group increased by one unit.

15. A device for coding a code vector included in a known group of code vectors, comprising:

means of determining a first number and a second number of bits which can be used to code a code vector, as a function of a number of code vectors in the group, and means of allocating an integer index to the code vector, means of determining an even delimiter, means of comparing the integer index with the delimiter, mean of coding the index decreased by half the delimiter, using the first number of bits, if the index is greater than or equal to the delimiter, and means of coding the index using the second number of bits, if the index is less than the delimiter.

16. The device according to claim 15, further comprising means of determining the code vector, said means of determining the code vector comprising:

means of dividing a set of data into vectors;

means of vector quantization of a vector, using a known set of code vectors; and means of determining a group of code vectors to which the code vector used for quantizing the vector belongs.

17. The device according to claim 15, adapted to determine a group of code vectors which includes the code vectors with a same norm.

18. The device according to claim 15, adapted to determine the first number of bits by calculating the largest integer which is not larger than the logarithm to the base 2 of the number of code vectors contained in the group.

19. The device according to claim 15, adapted to determine the second number of bits by calculating the largest integer which is not larger than the logarithm to the base 2 of the number of code vectors contained in the group increased by one unit.

20. A device for coding a code vector included in a known group of code vectors, comprising:

means of determining a first number and a second number of bits which can be used to code the code vector, as a function of a number of code vectors in the group, and means of allocating an integer index to the code vector, means of determining a delimiter, means of comparing the index with the delimiter, in order to select the first number of bits or the second number of bits according to the result of the comparison, and means of coding the vector by using the first number of bits or the second number of bits according to the result of the selection.

21. The device according to claim 20, further comprising means of determining the code vector, said means of determining the code vector comprising:

means of dividing a set of data into vectors;

means of vector quantization of a vector, using a known set of code vectors; and means of determining a group of code vectors to which the code vector used for quantizing the vector belongs.

22. The device according to claim 20, adapted to determine a group of code vectors which includes the code vectors with a same norm.

23. The device according to claim 20, adapted to determine the first number of bits by calculating the largest integer which is not larger than the logarithm to the base 2 of the number of code vectors contained in the group.

24. The device according to claim 20, adapted to determine the second number of bits by calculating the largest integer which is not larger than the logarithm to the base 2 of the number of code vectors contained in the group increased by one unit.

* * * * *

UNITED STATES PATENT AND TRADEMARK OFFICE
CERTIFICATE OF CORRECTION

PATENT NO. : 6,728,413 B2  
APPLICATION NO. : 09/232213  
DATED : April 27, 2004  
INVENTOR(S) : Patrice Onno Page 1 of 1

It is certified that error appears in the above-identified patent and that said Letters Patent is hereby corrected as shown below:

ON TITLE PAGE AT (56) OTHER PUBLICATIONS

After "Claude Lamblin:" ref. "a" should read --à--.

TITLE PAGE AT (56) U.S. PATENT DOCUMENTS

"RE34,562 E" should read --Re. 34,562 E--.

COLUMN 16

Line 36, "+$\lambda D_{2,i,m}$," should read --+$\lambda.D_{2,i,m}$,--.

Signed and Sealed this

Twenty-second Day of August, 2006

JON W. DUDAS  
*Director of the United States Patent and Trademark Office*